United States Patent
Punzo et al.

(10) Patent No.: US 12,056,369 B2
(45) Date of Patent: Aug. 6, 2024

(54) REFRESHING A MEMORY BLOCK ON POWER UP BASED ON AN AGE AND/OR TEMPERATURE CONDITION

(71) Applicant: Micron Technology, Inc., Boise, ID (US)

(72) Inventors: Domenico Punzo, Naples (IT); Felice Cosenza, Naples (IT); Domenico Balzano, Torre Annunziata (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/934,940

(22) Filed: Sep. 23, 2022

(65) Prior Publication Data

US 2024/0103737 A1    Mar. 28, 2024

(51) Int. Cl.
*G06F 3/06* (2006.01)
(52) U.S. Cl.
CPC .......... *G06F 3/0619* (2013.01); *G06F 3/0653* (2013.01); *G06F 3/0679* (2013.01)
(58) Field of Classification Search
CPC ..... G06F 3/0619; G06F 3/0653; G06F 3/0679
See application file for complete search history.

(56) References Cited

U.S. PATENT DOCUMENTS 11,210,031 B1 * 12/2021 Mekhanik ............. G06F 3/0679
11,501,837 B1 * 11/2022 Prakash ............. G11C 16/0483
2012/0033519 A1 * 2/2012 Confalonieri ...... G11C 16/3431
  365/222
2020/0135264 A1 * 4/2020 Brady ................... G11C 11/406
2020/0257472 A1 * 8/2020 Garcia ................ G06F 12/0284
2020/0258565 A1 * 8/2020 Schaefer ............. G11C 11/2275
2021/0279130 A1 * 9/2021 Mizushima ............ G01K 3/005

OTHER PUBLICATIONS

Li, Dawei, et al. "Adaptive thermal management for 3D ICs with stacked DRAM caches." Proceedings of the 54th Annual Design Automation Conference 2017. 2017. (Year: 2017).*
Ghosh, Mrinmoy, and Hsien-Hsin S. Lee. "Smart refresh: An enhanced memory controller design for reducing energy in conventional and 3D die-stacked DRAMs." 40th Annual IEEE/ACM international symposium on microarchitecture (Micro 2007). IEEE, 2007. (Year: 2007).*

* cited by examiner

*Primary Examiner* — Nicholas J Simonetti
(74) *Attorney, Agent, or Firm* — Harrity & Harrity, LLP

(57) ABSTRACT

In some implementations, a memory device may detect power up and may identify, based on detecting the power up, a plurality of blocks of the memory device for which a power up based refresh determination is to be performed. The memory device may perform the power up based refresh determination on the plurality of blocks. The memory device may determine whether a block, of the plurality of blocks, satisfies at least one of an age condition that is based on a difference between a current time and an opening time associated with opening the block for programming, or a temperature condition that is based on a difference between a current temperature and an opening temperature associated with the block at the opening time. The memory device may selectively refresh the block based on determining whether the block satisfies at least one of the age condition or the temperature condition.

25 Claims, 10 Drawing Sheets

REFRESHING A MEMORY BLOCK ON POWER UP BASED ON AN AGE AND/OR TEMPERATURE CONDITION

TECHNICAL FIELD

The present disclosure generally relates to memory devices, memory device operations, and, for example, to refreshing a memory block on power up based on an age and/or temperature condition.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
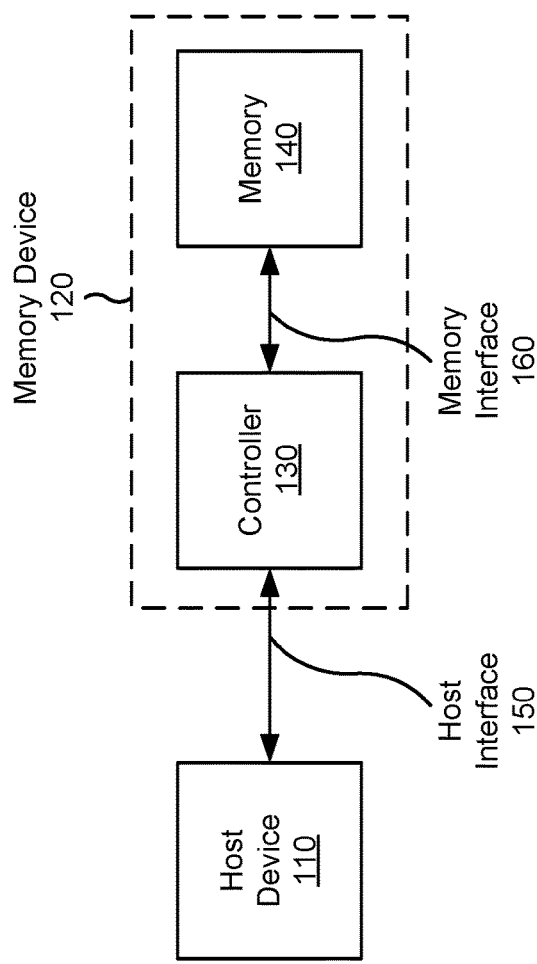
FIG. 1 is a diagram illustrating an example system capable of refreshing a memory block on power up based on an age and/or temperature condition.

A memory device may utilize memory, including any combination of non-volatile memory arrays and/or volatile memory arrays, to store data. In some implementations, non-volatile memory devices can be provided by negative-and (NAND) type flash memory devices and/or solid state drives (SSDs). Other examples of non-volatile memory devices are described below in connection with FIG. 1. A non-volatile memory device is a package of one or more die. Each die may include one or more planes. Planes may be grouped into logic units (LUNs). For some types of non-volatile memory devices (e.g., NAND devices), each plane may include a set of physical blocks. Each block may include a set of pages. Each page may include a set of memory cells (sometimes referred to herein as "cells"). A cell may be an electronic circuit that stores information.

Data operations may be performed by the non-volatile memory device. For example, the non-volatile memory device may receive access requests (e.g., a write command or a read command), such as to store data on a memory at the non-volatile memory device and/or to read data from the memory on the non-volatile memory device. The memory device may retain the stored data over time (e.g., over a life span of the memory device).

However, data retention degradation (e.g., a reduction of cell capacitance to retain stored data) and cross-temperature effects (e.g., write operations and read operations of the non-volatile memory devices occurring at different temperatures) can impact the reliability and/or the functionality of non-volatile memory devices. Data retention degradation may be associated with extended periods of storage (e.g., unpowered storage), and cross-temperature effects may be associated with write operations and read operations occurring at different temperatures outside of a temperature threshold (e.g., a temperature range).

In some cases, extended periods of storage and cross-temperature effects may be critical in NAND-based memory devices. For example, data retention degradation due to extended periods of storage may negatively impact data integrity, and cross-temperature effects based on a difference in temperature between a write operation and a read operation may cause data corruption during read operations associated with NAND-based memory devices.

Accordingly, failure to mitigate data retention degradation and/or cross-temperature effects may result in negative impacts to the reliability and/or the functionality of on-volatile memory devices. One way to address these issues is to perform refresh operations on blocks of the non-volatile memory devices at suitable times and/or under safe conditions (e.g., environmental conditions, such as a safe temperature).

In some cases, read-based refresh operations may be used to refresh a block of a non-volatile memory device. For example, a read operation associated with the block of the non-volatile memory device may be performed, followed by a rewrite of the read data to another block of the non-volatile memory device. However, read-based refresh operations do not account for system parameters (e.g., a system operative date and/or environmental conditions, such as a temperature condition) of the non-volatile memory device. As such, read-based refresh operations may occur at unsuitable times and/or during unsafe environmental conditions and may degrade memory cells, reduce the life span of the non-volatile memory device, and/or negatively impact data integrity.

Some implementations described herein enable refreshing a memory block on power up based on an age and/or temperature condition. For example, a memory device (e.g., a NAND flash memory device) may be configured to detect power up of the memory device. The memory device may be configured to determine that a block of the memory device satisfies a refresh condition (e.g., one or more refresh conditions). In some implementations, a refresh condition may be based on a block parameter, an age condition, a temperature condition, and/or a threshold. For example, a block parameter (e.g., an age parameter, a temperature parameter, and/or an identifier), an age condition, and/or a temperature condition may be compared to a threshold (e.g., an age threshold and/or a temperature threshold), to determine whether a refresh condition is satisfied. In some implementations, a refresh condition may be associated with a priority level (e.g., high priority or low priority). In some implementations, the memory device may be configured to store an indication that indicates whether a block is to be refreshed with priority (e.g., a high priority refresh or a low priority refresh) based on a priority level associated with a refresh condition. The memory device may be configured to refresh a block based on a refresh condition being satisfied. In some implementations, a block may be refreshed with priority (e.g., high priority or low priority) based on a stored indication that indicates whether a block is to be refreshed with priority. In some implementations, a refresh condition may be based on a threshold (e.g., one or more age thresholds and/or one or more temperature thresholds).

As a result, refresh operations on blocks of non-volatile memory devices may be performed at suitable times and under safe conditions. This mitigates data retention degradation along a life span of the non-volatile memory devices, reduces refresh operation performed under unsafe conditions, improves data integrity, limits usage of error handling management during read operations, and reduces read disturbs associated with non-volatile memory devices.

FIG. 1 is a diagram illustrating an example system 100 capable of refreshing a memory block on power up based on an age and/or temperature condition. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMNIC) device. In this case, the memory 140 may include non-volatile memory configured to maintain stored data after the memory device 120 is powered off. For example, the memory 140 may include NAND memory or NOR memory.

In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the memory device 120 and/or the controller 130 may be configured to detect power up of the memory device; determine, based on detecting the power up of the memory device, that a block of the memory device satisfies at least one of: a first age condition that is based on a difference between a current time and an opening time associated with opening the block for programming, a second age condition that is based on the difference between the current time and the opening time, a first temperature condition that is based on a difference between a current temperature and an opening temperature associated with the block at the opening time, or a second temperature condition that is based on the difference between the current temperature and the opening temperature; store an indication of whether the block is to be refreshed with high priority or low priority based on determining that the block satisfies at least one of the first age condition, the second age condition, the first temperature condition, or the second temperature condition, wherein the block is to be refreshed with high priority if the first age condition or the first temperature condition is satisfied, and wherein the block is to be refreshed with low priority if the second age condition or the second temperature condition is satisfied; and refresh the block based on the indication of whether the block is to be refreshed with high priority or low priority.

In some implementations, the memory device 120 and/or the controller 130 may be configured to detect power up of the memory device; identify, based on detecting the power up of the memory device, a plurality of blocks of the memory device for which a power up based refresh determination is to be performed; perform the power up based refresh determination on the plurality of blocks; determine, based on performing the power up based refresh determination, whether a block, of the plurality of blocks, satisfies at least one of: an age condition that is based on a difference between a current time and an opening time associated with opening the block for programming, or a temperature condition that is based on a difference between a current temperature and an opening temperature associated with the block at the opening time; and selectively refresh the block based on determining whether the block satisfies at least one of the age condition or the temperature condition.

In some implementations, the memory device 120 and/or the controller 130 may be configured to initiate a memory block refresh determination within a threshold amount of time of the memory device being powered up; identify, based on performing the memory block refresh determination, a set of memory blocks of the memory device that are to be refreshed, wherein each memory block, included in the set of memory blocks, satisfies at least one of: a high priority refresh condition that is based on a parameter of that memory block satisfying a first threshold, or a low priority refresh condition that is based on the parameter of that memory block satisfying a second threshold and not satisfying the first threshold; and refresh each memory block included in the set of memory blocks based on whether that memory block satisfies the high priority refresh condition or the low priority refresh condition, wherein every memory block that satisfies the high priority refresh condition is refreshed before any memory blocks that satisfy the low priority refresh condition are refreshed.

As indicated above, FIG. 1 is provided as an example. Other examples may differ from what is described with regard to FIG. 1.

Figure 2:
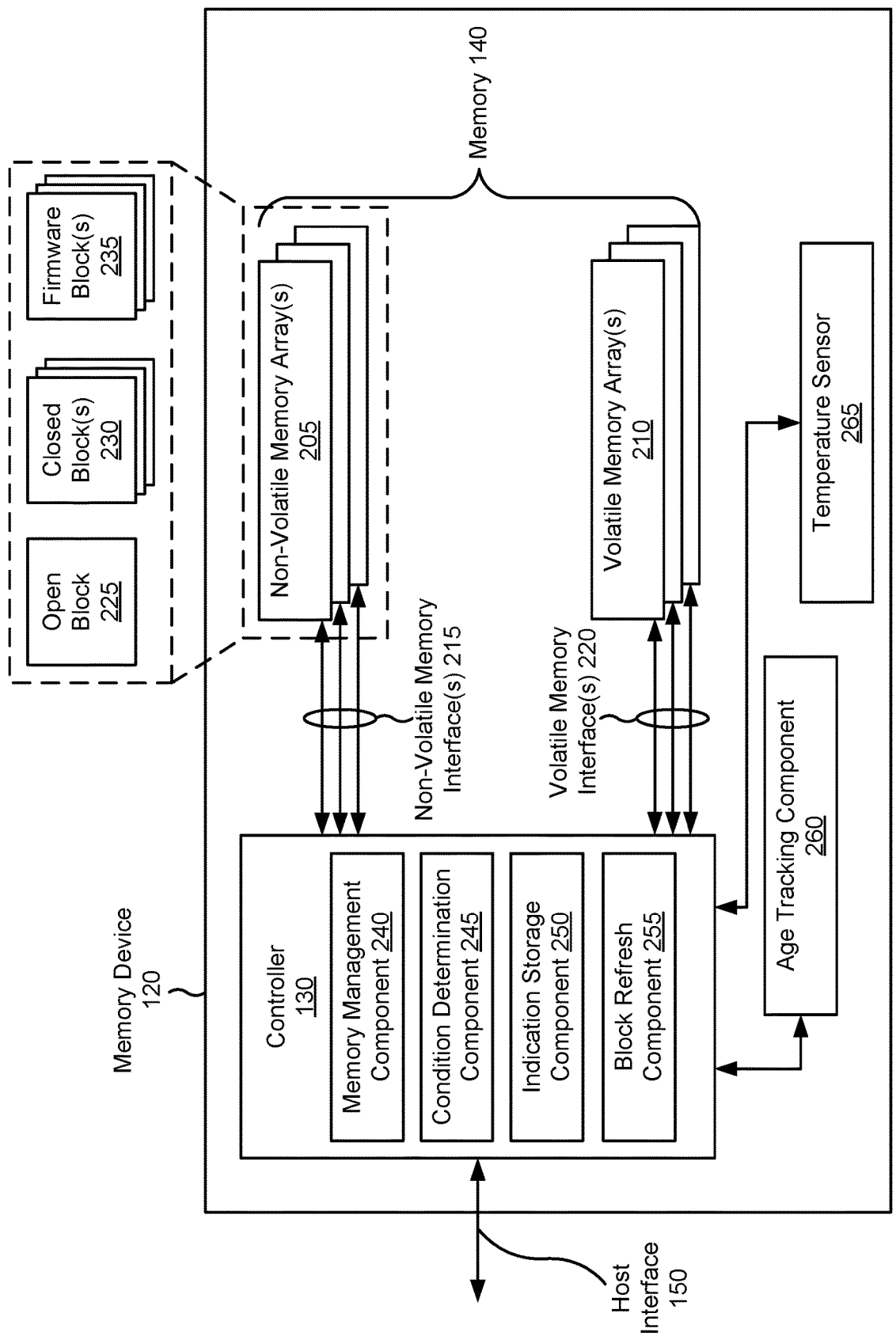
FIG. 2 is a diagram of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 205, such as one or more NAND memory arrays and/or one or more NOR memory arrays. Additionally, or alternatively, the memory 140 may include one or more volatile memory arrays 210, such as one or more SRAM arrays and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array). In some implementations, the controller 130 may include or may communicate with volatile memory (e.g., SRAM) to manage data and instruction execution.

As shown in FIG. 2, the non-volatile memory array 205 may include one or more block types, such as an open block 225, one or more closed blocks 230, and one or more firmware blocks 235. An open block 225 may be referred to as an open user data block, and a closed block 230 may be referred to as a closed user data block. An open block 225 may be a block that is at least partially written (e.g., programmed). For example, an open block 225 may be a host-addressable user data block (e.g., a block that is accessible, readable, and/or writable by the host device 110) that may include one or more written pages, sometimes called programmed pages, and one or more writable pages (e.g., that are unwritten or that have not yet been written), sometimes called unprogrammed pages or programmable pages. Additionally, or alternatively, an open block 225 may be a block that is fully unwritten or fully unprogrammed (e.g., where none of the pages of the block have been written). For example, an open block 225 may be a block including a particular quantity of pages, where each page is writable (e.g., each page of the particular quantity of pages has not been previously written or each page of the particular quantity of pages has been erased via an erase operation such that one or more of the erased pages is writable). Thus, an open block 225 may include one or more programmed pages and one or more unprogrammed (or empty) pages.

A closed block 230 may be a block that is fully written. For example, a closed block 230 may be a host-addressable user data block that may include a particular quantity of pages, where each page (or a threshold quantity of pages) of the particular quantity of pages is written. In some implementations, an open block 225 may transition to a closed block 230 when the open block 225 is fully written (e.g., all pages or a threshold quantity of pages of the open block 225 have been written). For example, an open block 225 including a particular quantity of pages, where one or more pages of the particular quantity of pages is unwritten (e.g., unprogrammed), may transition to a closed block 230 when each of the one or more unwritten pages is written. In some implementations, a closed block 230 may transition to an open block 225 when the closed block 230 is erased by an erase operation. For example, a closed block 230 may include a particular quantity of pages, where each page of the particular quantity of pages has been written and subsequently erased via an erase operation, such that one or more pages of the erased pages is writable. Thus, a closed block 230 may be a block that includes programmed pages and that cannot be programmed again until the block is erased.

A firmware block 235 may be a block that stores firmware (e.g., firmware instructions and/or firmware data) of the memory device 120. For example, a firmware block 235 may be a non-host addressable data block (e.g., a block that is not accessible, readable, and/or writable by the host device 110) that may include one or more written pages and one or more writable pages. In some implementations, a firmware block 235 may be an open firmware block that is partially programmed or a closed firmware block that cannot be programmed again until after being erased.

As shown in FIG. 2, the controller 130 may include a memory management component 240, a condition determination component 245, an indication storage component 250, a block refresh component 255, an age tracking component 260, and/or a temperature sensor 265. In some implementations, one or more of these components are implemented as one or more instructions (e.g., firmware) executed by the controller 130. Alternatively, one or more of these components may be implemented as dedicated integrated circuits distinct from the controller 130.

The memory management component 240 may be configured to manage performance of the memory device 120. For example, the memory management component 240 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 240, such as information regarding memory block age, memory block erase count, and/or error information associated with a memory partition (e.g., a memory cell, a row of memory, a block of memory, or the like).

The condition determination component 245 may be configured to determine whether one or more conditions, associated with one or more blocks (e.g., an open block 225, a closed block 230, and/or a firmware block 235) of the memory device 120, are satisfied. For example, the condition determination component 245 may determine (e.g., based on detecting the power up of the memory device 120) that one or more blocks of the memory device 120 satisfy one or more conditions (e.g., one or more refresh conditions). In some implementations, the one or more conditions may include a first age condition, a second age condition, a first temperature condition, and/or a second temperature condition.

The indication storage component 250 may be configured to store an indication of whether one or more blocks are to be refreshed. In some implementations, the indication storage component 250 may store an indication of whether one or more blocks are to be refreshed with high priority or low priority.

The block refresh component 255 may be configured to selectively refresh one or more blocks based on determining whether the block satisfies a refresh condition (e.g., an age and/or a temperature condition). In some implementations, the block refresh component 255 may selectively refresh one or more blocks based on an associated priority (e.g., a high priority or a low priority).

The age tracking component 260 may be configured to track memory block age information. For example, memory block age information may include a time (e.g., a date or a date and a time of day) associated with operations performed on the memory block, such as a write operation, a read operation, an erase operation, and/or an analysis operation. In some implementations, the age tracking component 260 may track an elapsed time between operations performed on the memory block. For example, the age tracking component 260 may track an elapsed time between a time at which a write operation is performed on the block (e.g., when the block is opened) and a time at which the memory block is being analyzed (described below). In some implementations, the age tracking component 260 may store (e.g., in memory 140) the memory block age information in one or more age tracking tables, such as a lookup table.

The temperature sensor 265 may be configured to sense (e.g., detect) temperature information associated with the memory device. For example, temperature information may include an operating temperature of the memory device 120, a storage temperature (e.g., an on shelf or in system storage temperature) of the memory device 120, and/or a temperature of a component of the memory device 120 over a life span of the memory device. For example, the temperature sensor 265 may sense a temperature of the memory device 120 over a time period such that an average temperature of the memory device 120 over the time period may be tracked and/or at a time at which operations are performed on a memory block (e.g., a write operation, a read operation, an erase operation, and/or analysis operations. In some implementations, the temperature sensor 265 may store (e.g., in memory 140) the temperature information in one or more information tables, such as a lookup table.

One or more devices or components shown in FIG. 2 may be configured to perform operations described elsewhere herein, such as one or more operations and/or methods described in connection with FIGS. 4-7. For example, the controller 130, the memory management component 240, the condition determination component 245, the indication storage component 250, the block refresh component 255, the age tracking component 260, and/or the temperature sensor 265 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
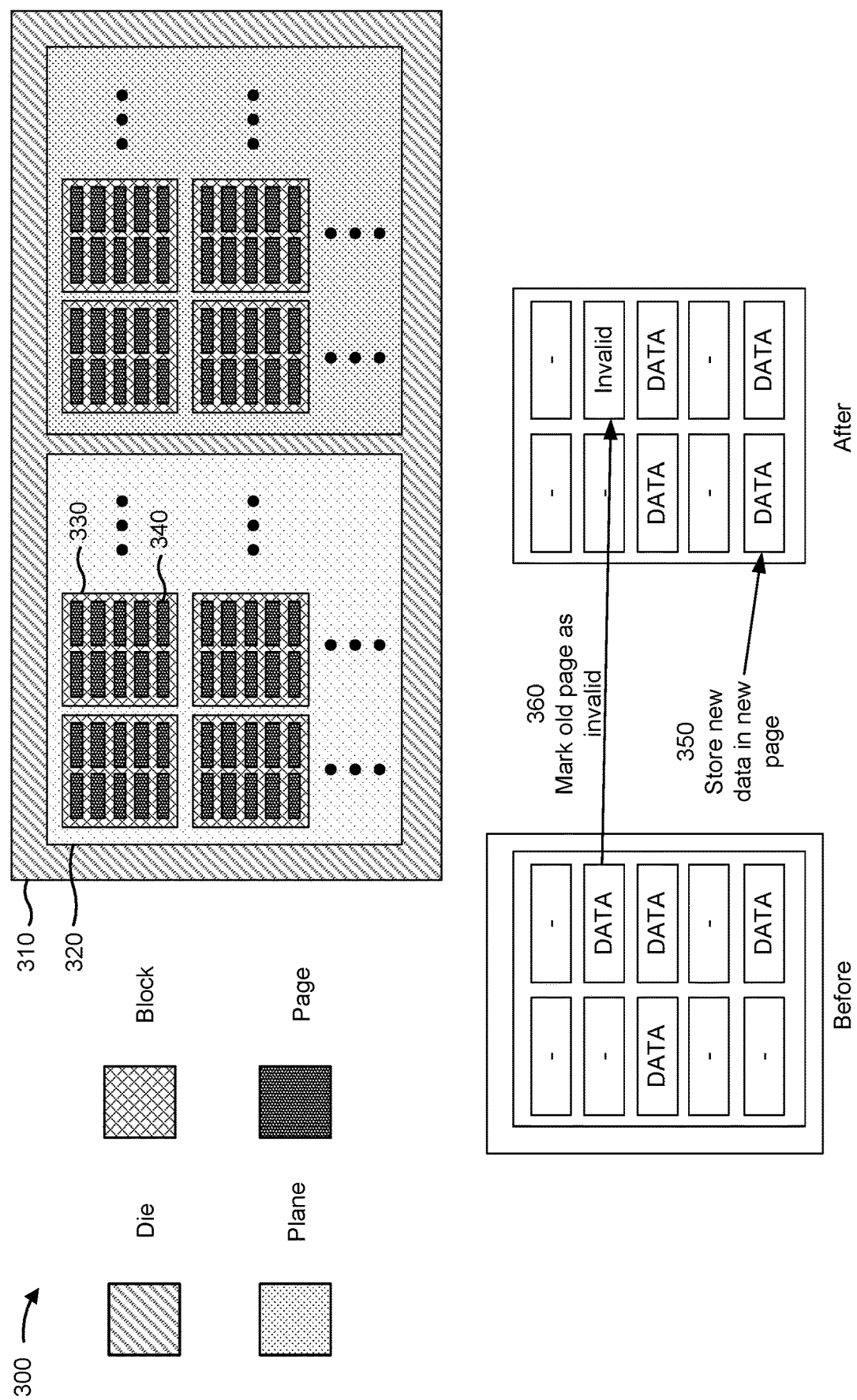
FIG. 3 is a diagram illustrating an example memory architecture that may be used by the memory device.

FIG. 3 is a diagram illustrating an example memory architecture 300 that may be used by the memory device 120. The memory device 120 may use the memory architecture 300 to store data. As shown, the memory architecture 300 may include a die 310, which may include multiple planes 320. A plane 320 may include multiple blocks 330. A block 330 may include multiple pages 340. Although FIG. 3 shows a particular quantity of planes 320 per die 310, a particular quantity of blocks 330 per plane 320, and a particular quantity of pages 340 per block 330, these quantities may be different than what is shown. In some implementations, the memory architecture 300 is a NAND memory architecture.

The die 310 is a structure made of semiconductor material, such as silicon. In some implementations, a die 310 is the smallest unit of memory that can independently execute commands. A memory device 120 may include one or more dies 310. In some implementations, the memory device 120 may include multiple dies 310. In this case, multiples dies 310 may each perform a respective memory operation (e.g., a read operation, a write operation, or an erase operation) in parallel. For example, a controller 130 of the memory device 120 may be configured to concurrently perform memory operations on multiple dies 310 for parallel control.

Each die 310 of a memory device 120 includes one or more planes 320. A plane 320 is sometimes called a memory plane. In some implementations, identical and concurrent operations can be performed on multiple planes 320 (sometimes with restrictions). For example, a multi-plane command (e.g., a multi-plane read command or a multi-plane write command) may be executed on multiple planes 320 concurrently, whereas a single plane command (e.g., a single plane read command or a single plane write command) may be executed on a single plane 320. A logical unit of the memory device 120 may include one or more planes 320 of a die 310. In some implementations, a logical unit may include all planes 320 of a die 310 and may be equivalent to a die 310. Alternatively, a logical unit may include fewer than all planes 320 of a die 310. A logical unit may be identified by a logical unit number (LUN). Depending on the context, the term "LUN" may refer to a logical unit or an identifier (e.g., a number) of that logical unit.

Each plane 320 includes multiple blocks 330. A block 330 is sometimes called a memory block. Each block 330 includes multiple pages 340. A page 340 is sometimes called a memory page. A block 330 is the smallest unit of memory that can be erased. In other words, an individual page 340 of a block 330 cannot be erased without erasing every other page 340 of the block 330. A page 340 is the smallest unit of memory to which data can be written (i.e., the smallest unit of memory that can be programmed with data). The terminology "programming" memory and "writing to" memory may be used interchangeably. A page 340 may include multiple memory cells that are accessible via the same access line (sometimes called a word line). In some implementations, a block 330 may be divided into multiple sub-blocks. A sub-block is a portion of a block 330 and may include a subset of pages 340 of a block and/or a subset of memory cells of a block 330.

In some implementations, read and write operations are performed for a specific page 340, while erase operations are performed for a block 330 (e.g., all pages 340 in the block 330). In some implementations, to prevent wearing out of memory, all pages 340 of a block 330 may be programmed before the block 330 is erased to enable a new program operation to be performed to a page 340 of the block 330. After a page 340 is programmed with data (called "old data" below), that data can be erased, but that data cannot be overwritten with new data prior to being erased. The erase operation would erase all pages 340 in the block 330, and erasing the entire block 330 every time that new data is to replace old data would quickly wear out the memory cells of the block 330. Thus, rather than performing an erase operation, the new data may be stored in a new page (e.g., an empty page), as shown by reference number 350, and the old page that stores the old data may be marked as invalid, as shown by reference number 360. The memory device 120 may then point operations associated with the data to the new page (e.g., in an address table) and may track invalid pages to prevent program operations from being performed on invalid pages prior to an erase operation.

When a block 330 satisfies an erasure condition, the memory device 120 may select the block 330 for erasure, copy the valid data of the block 330 (e.g., to a new block 330 or to the same block 330 after erasure), and erase the block 330. For example, the erasure condition may be that all pages 340 of the block 330 or a threshold quantity or percentage of pages 340 of the block 330 are unavailable for further programming (e.g., are either invalid or already store valid data). As another example, the erasure condition may be that a quantity or percentage of free pages 340 of the block 330 (e.g., pages 340 that are available to be written) is less than (or equal to) a threshold. The process of selecting a block 330 satisfying an erasure condition, copying valid pages 340 of that block 330 to a new block 330 (or the same block 330 after erasure), and erasing the block 330 is sometimes called garbage collection and is used to free up memory space of the memory device 120.

As indicated above, FIG. 3 is provided as an example. Other examples may differ from what is described with regard to FIG. 3.

Figure 4:
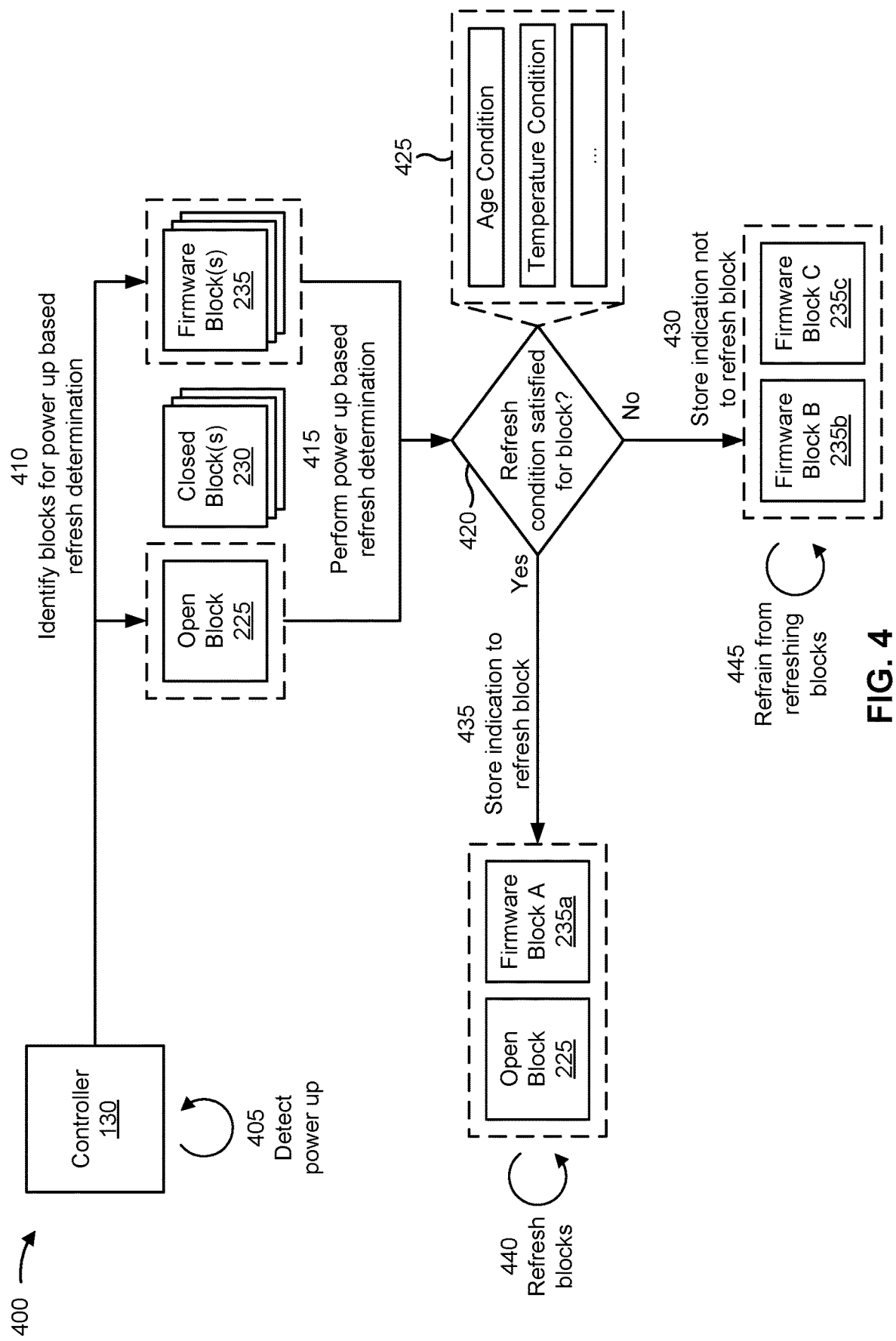
FIGS. 4-6 are diagrams of examples of refreshing a memory block on power up based on an age and/or temperature condition.

FIG. 4 is a diagram of an example 400 of refreshing a memory block on power up based on an age and/or temperature condition. The operations described in connection with FIG. 4 may be performed by the memory device 120 and/or one or more components of the memory device 120, such as the controller 130.

As shown by reference number 405, the memory device 120 may detect power up of the memory device 120. For example, the memory device 120 may receive power, may be powered up, may receive a power up command from the host device 110, or the like. The memory device 120 may initiate a power up sequence based on detecting the power up event. The power up sequence may include performing a power up based refresh determination, as described below.

As shown by reference number 410, the memory device 120 may identify, based on detecting the power up of the memory device 120, a candidate block (e.g., an open block 225, one or more closed blocks 230, and/or one or more firmware blocks 235) of the memory device 120 for which a power up based refresh determination is to be performed. A power up based refresh determination may include a refresh determination procedure (described below) that is performed based on power up of the memory device 120

(e.g., during a power up sequence of the memory device) rather than a read-based refresh determination (described above). For example, a power up based refresh determination may be performed before any host read commands and/or host write commands are executed. Conversely, a read-based refresh determination may be performed after executing a host read command (e.g., based on detecting an error associated with reading data based on the host read command). Using a power up based refresh determination, the memory device 120 may selectively refresh a block based on a condition associated with that block at power up of the memory device 120. In some implementations, the memory device 120 may identify a plurality of blocks (e.g., from an open block 225, a closed block 230, and/or a firmware block 235) as candidates for which a power up based refresh determination is to be performed.

In some implementations, the memory device 120 may perform the power up based refresh determination on all open blocks 225 (which, in some cases, includes only a single open block 225) and/or on all firmware blocks 235. Thus, in some implementations, the memory device 120 may identify all open blocks 225 and all firmware blocks 235 as candidate blocks to be analyzed during the power up based refresh determination (e.g., to determine whether any of those candidate blocks are to be refreshed). In some implementations, the memory device 120 may perform the power up based refresh determination on only open blocks 225 (e.g., all open blocks 225). In some implementations, the memory device 120 may perform the power up based refresh determination on only firmware blocks 235 (e.g., all firmware blocks 235). Thus, in some implementations, the memory device 120 may identify only open blocks 225 or only firmware blocks as candidate blocks to be analyzed during the power up based refresh determination (e.g., to determine whether any of those candidate blocks are to be refreshed). Additionally, or alternatively, the memory device 120 may perform the power up based refresh determination on closed blocks 230. Thus, in some implementations, the memory device 120 may identify all closed blocks 235 as candidate blocks to be analyzed during the power up based refresh determination (e.g., to determine whether any of those candidate blocks are to be refreshed).

In some implementations, the memory device 120 may store an indication of an open block 225, one or more closed blocks 230, and/or one or more firmware blocks 235 (e.g., using a block identifier). The memory device 120 may use the stored indication to identify one or more open blocks 225, one or more closed blocks 230, and/or one or more firmware blocks 235 for which the power up based refresh determination is to be performed. In some cases, open blocks 225 and/or firmware blocks 235 may store more important data, such as recent data for an open block 225 and firmware for a firmware block 235, than the closed blocks 230. Thus, performing the power up based refresh determination on only the open blocks 225 and/or on only the firmware blocks 235 (and not on the closed blocks 235) may ensure that important data is not lost and may consume fewer processing and memory resources (as well as reducing latency) than performing the power up based refresh determination on all blocks (e.g., including closed blocks 230). On the other hand, performing the power up based refresh determination on all blocks (e.g., including closed blocks 230) may improve reliability for all blocks of the memory device 120.

In some implementations, the memory device 120 may identify a subset of all blocks of the memory device 120 (e.g., a quantity of open blocks 225 and firmware blocks 235 but no closed blocks 230) to perform the power up based refresh determination. This saves time, conserves resources, reduces a power up time, and reduces latency for performing other memory operations as compared to performing the power up based refresh determination on all blocks of the memory device 120.

In the example 400, the memory device 120 identifies an open block 225, a first firmware block 235a (shown as firmware block A), a second firmware block 235b (shown as firmware block B), and a third firmware block 235c (shown as firmware block C) as candidates for which a power up based refresh determination is to be performed.

As shown by reference number 415, the memory device 120 may perform the power up based refresh determination based on the identified candidate blocks (e.g., the open block 225, firmware block A, firmware block B, and firmware block C in example 400). The power up based refresh determination may be performed on the candidate blocks by analyzing each of the candidate blocks (as described below) to determine whether any of those blocks is to be refreshed. For example, performing the power up based refresh determination for a candidate block may include analyzing a block (e.g., a block parameter, an age condition, and/or a temperature condition associated with a candidate block), to determine whether a refresh condition is satisfied for the candidate block, as described below.

As shown by reference number 420, the memory device 120 may determine, based on performing the power up based refresh determination, whether a candidate block (e.g., the open block 225, firmware block A, firmware block B, and firmware block C in example 400) satisfies a refresh condition. More particularly, as shown by reference number 425, the memory device 120 may determine, based on performing the power up based refresh determination, whether a candidate block satisfies an age condition (e.g., one or more age conditions) and/or a temperature condition (e.g., one or more temperature conditions). Thus, in some implementations, a refresh condition includes an age condition and/or a temperature condition, as described in more detail elsewhere herein.

In some implementations, an age condition may be based on a comparison between an age threshold (e.g., one or more age thresholds) and a difference between a current time and an opening time associated with the candidate block (e.g., a numerical difference between the current time and the opening time). In some implementations, an age condition is satisfied if a difference between a current time and an opening time associated with the candidate block is greater than (or equal to) an age threshold. In some implementations, an age condition is not satisfied if a difference between a current time and an opening time associated with the candidate block is less than (or equal to) an age threshold.

In some implementations, a current time may be associated with performing a power up based refresh determination for the candidate block (e.g., a date or time at which a power up based refresh determination is initiated for the candidate block), or a date or time associated with powering up of the memory device 120 to trigger the power up based refresh determination for the candidate block (described below). For example, a current time may be a time (e.g., a date, a date and a time of day, or a time counter value) at which the candidate block is analyzed to determine whether a refresh condition is satisfied for the candidate block. In some implementations, an opening time may be associated with opening the candidate block for programming. For example, an opening time may be a time (e.g., a date, a date and time of day, or a time counter value) at which the candidate block is configured for writing of initial data to the block, a time at which the block is assigned a host-addressable address, a time at which initial data is programmed to the block, or a time at which data is programmed to the block after erasing the block. In some implementations, an age threshold may be a numerical value, such as a numerical value corresponding to a number of days or a value associated with a time counter.

For example, if a candidate block is opened for programming (e.g., assigned a host-addressable address) on a first date (e.g., Jan. 1, 2020), and if the memory device 120 performs a power up based refresh determination for the candidate block on a second date (e.g., Jan. 5, 2020), a difference between the current time and the opening time is a difference between the first date and the second date (e.g., a difference between Jan. 1, 2020, and Jan. 5, 2020, is four days). Thus, in some implementations, an age condition may be based on an elapsed time between a time that a candidate block is opened (e.g., for initial programming) and a time that the memory device 120 performs the power up based refresh determination on the candidate block.

As an example, if a difference between a current time and an opening time associated with a candidate block is four days, and an age threshold is five days, the memory device 120 may determine that the candidate block does not satisfy the age threshold (e.g., four days is less than five days).

In some implementations, a temperature condition may be based on a comparison between a temperature threshold (e.g., one or more temperature thresholds) and a difference in a current temperature (e.g., measured in degrees Celsius, degrees Fahrenheit, or the like), associated with the candidate block at the current time, and an opening temperature (e.g., measured in degrees Celsius, degrees Fahrenheit, or the like) associated with the candidate block at the opening time. In some implementations, a temperature condition is satisfied if a difference between a current temperature and an opening temperature associated with the candidate block is greater than (or equal to) a temperature threshold. In some implementations, a temperature condition is not satisfied if a difference between a current temperature and an opening temperature associated with the candidate block is less than (or equal to) a temperature threshold.

In some implementations, a current temperature may be a temperature associated with the memory device 120 or the candidate block at a time at which the power up based refresh determination is initiated for the candidate block, or a temperature associated with the memory device 120 or the candidate block at a time associated with powering up of the memory device 120 to trigger the candidate block refresh determination (described below). For example, a current temperature may be a temperature (e.g., 20° C.) of the memory device 120 at the current time (e.g., a time at which the candidate block is analyzed to determine whether a refresh condition is satisfied for the candidate block). For example, an opening temperature may be a temperature (e.g., 30° C.) of the memory device 120 at the opening time (e.g., a time at which the candidate block is opened for programming). For example, the temperature difference between a current temperature of 20° C. and an opening temperature of 30° C. is 10° C. Thus, in some implementations, a temperature condition may be based on a temperature difference (e.g., an absolute value temperature difference) between a temperature of the memory device 120 at the current time and a temperature of the memory device 120 at the opening time associated with the candidate block. In some implementations, a temperature threshold may be a temperature value (e.g., measured in degrees Celsius, degrees Fahrenheit, or the like).

For example, if a difference between a current temperature and an opening temperature associated with a candidate block is 80° C., and a temperature threshold is 70° C., the memory device 120 may determine that the candidate block satisfies the temperature threshold (e.g., 80° C. is greater than 70° C.).

In some implementations, an age condition and/or a temperature condition may be based on a priority level (e.g., a high priority age condition, a low priority age condition, a high priority temperature condition, or a low priority temperature condition), as described in more detail elsewhere herein.

In the example 400, the memory device 120 determines that open block 225 and firmware block A satisfy a refresh condition (e.g., open block 225 and firmware block A satisfy an age and/or a temperature condition) and that firmware block B and firmware block C do not satisfy any refresh conditions (e.g., firmware block B and firmware block C do not satisfy any age and/or temperature conditions).

As shown by reference number 430, the memory device 120 may store an indication not to refresh a candidate block that does not satisfy any refresh conditions. In some implementations, the memory device 120 may store a block identifier that identifies a candidate block and/or a refresh indicator that indicates whether the candidate block is to be refreshed. In some implementations, a refresh indicator may have a first value (e.g., "1") if the candidate block is to be refreshed and may have a second value (e.g., "0") if the candidate block is not to be refreshed. In the example 400, the memory device 120 stores, based on a determination that firmware block B and firmware block C do not satisfy any refresh conditions, a block identifier that identifies firmware block B, a refresh indicator (e.g., 0) that indicates that firmware block B is not to be refreshed, a block identifier that identifies firmware block C, and a refresh indicator (e.g., 0) that indicates that firmware block C is not to be refreshed.

As shown by reference number 435, the memory device 120 may store an indication to refresh a candidate block that satisfies a refresh condition. In some implementations, the memory device 120 may store a set of refresh indicators associated with a set of blocks. In the example 400, the memory device 120 stores, based on a determination that open block 225 and firmware block A satisfy a refresh condition, a block identifier that identifies open block 225, a refresh indicator (e.g., 1) that indicates that open block 225 is to be refreshed, a block identifier that identifies firmware block A, and a refresh indicator (e.g., 1) that indicates that firmware block A is to be refreshed. In some implementations, a candidate block may be refreshed based on a priority level (e.g., a high priority refresh or a low priority refresh). As such, in some implementations, a refresh indicator may indicate "no refresh" if the candidate block is not to be refreshed, may indicate "high priority refresh" if the candidate block is to be refreshed with high priority, or may indicate "low priority refresh" if the candidate block is to be refreshed with low priority), as described in more detail elsewhere herein.

As shown by reference number 440, the memory device 120 may refresh a candidate block based on storing an indication that the candidate block is to be refreshed. For example, the memory device 120 may refresh, based on a block identifier identifying a candidate block and a refresh indicator indicating that the candidate block is to be refreshed, the candidate block by copying data (e.g., a portion of data or all data) stored in the candidate block to a new block. In some cases, data retention degradation due to extended periods of storage may negatively impact data integrity, and cross-temperature effects based on a difference in temperature between a write operation and a read operation may cause data corruption during read operations associated with a candidate block. Thus, performing the refresh on a candidate block based on a stored refresh indication enables the candidate block to be refreshed at suitable times and/or under safe conditions to mitigate data retention degradation and/or cross-temperature effects such that reliability and/or functionality associated with the candidate block is improved.

In some implementations, a new block to which data is written or copied may be a block that is writable (e.g., an open block 225), and the memory device 120 may determine a new opening time and a new opening temperature associated with the new block. In some implementations, a new opening time may be a time at which the memory device 120 refreshes a candidate block (e.g., copies data from the candidate block to a new block) or opens the new block for copying data from the candidate block. In some implementations, a new opening temperature may be a temperature of the memory device 120 at the new opening time, in a similar manner as described above. In some implementations, the memory device 120 may store a new block identifier that identifies the new block, the new opening time associated with the new block, and the new opening temperature associated with the new block in an entry of a data structure, as described in more detail elsewhere herein.

In the example 400, the memory device 120 refreshes open block 225 (e.g., copies data from open block 225 to a new block) based on the block identifier that identifies open block 225 and the refresh indicator that indicates that open block 225 is to be refreshed. The memory device 120 may determine a new block identifier, a new opening time, and a new opening temperature associated with copying the data from open block 225 to the new block. The memory device 120 may store the new block identifier, the new opening time and the new opening temperature in an entry of a data structure.

Further, in the example 400, the memory device 120 refreshes firmware block A (e.g., copies data from firmware block A to a new block) based on the block identifier that identifies firmware block A and the refresh indicator that indicates that firmware block A is to be refreshed. The memory device 120 may determine another new block identifier, another new opening time, and another new opening temperature associated with copying the data from firmware block A to another new block. The memory device 120 may store the new block identifier, the new opening time and the new opening temperature in an entry of a data structure.

As shown by reference number 445, the memory device 120 may refrain from refreshing a candidate block based on storing an indication that the block is not to be refreshed. For example, the memory device 120 may refrain from refreshing a candidate block based on a block identifier identifying a candidate block and a refresh indicator indicating that the candidate block is not to be refreshed. In some cases, candidate blocks do not need to be refreshed (e.g., if data was recently programmed into the candidate block or if a cross-temperature condition is not satisfied). Thus, refraining from refreshing a candidate block that does not need to be refreshed saves time and enables the memory device 120 to conserve resources. In the example 400, the memory device 120 refrains from refreshing firmware block B and firmware block C based on stored indications that firmware block B and firmware block C are not to be refreshed.

As indicated above, FIG. 4 is provided as an example. Other examples may differ from what is described with regard to FIG. 4.

Figure 5:
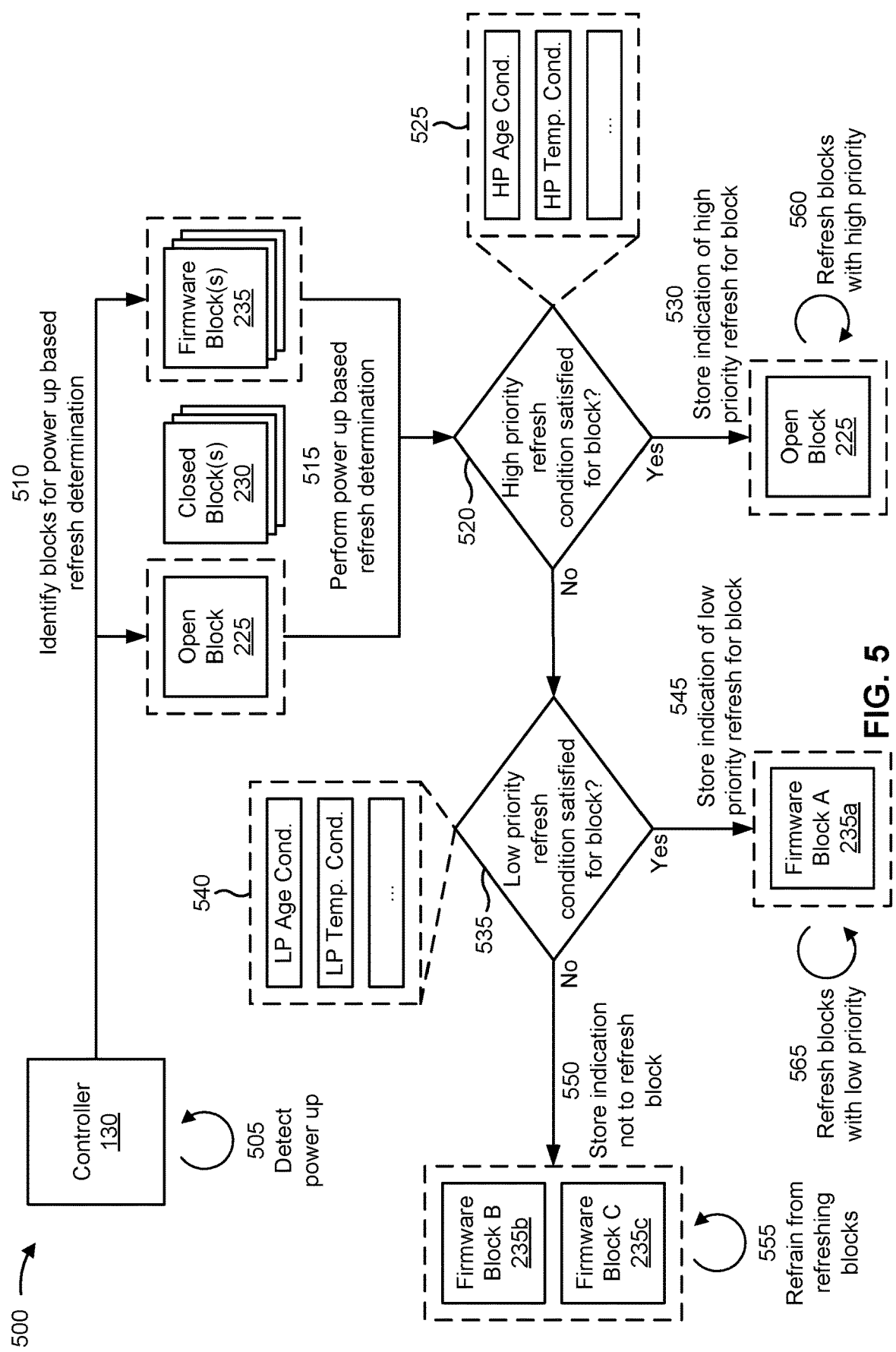

FIG. 5 is a diagram of an example 500 of refreshing a memory block on power up based on an age and/or temperature condition. The operations described in connection with FIG. 5 may be performed by the memory device 120 and/or one or more components of the memory device 120, such as the controller 130 and/or one or more components of the controller 130.

As shown by reference number 505, the memory device 120 may detect power up of the memory device 120. This may be performed as described above in connection with reference number 405 of FIG. 4 and/or elsewhere herein.

As shown by reference number 510, the memory device 120 may identify, based on detecting the power up of the memory device 120, a candidate block (e.g., an open block 225, one or more closed blocks 230, and/or one or more firmware blocks 235) of the memory device 120 for which a power up based refresh determination is to be performed. This may be performed as described above in connection with reference number 410 of FIG. 4 and/or elsewhere herein.

As shown by reference number 515, the memory device 120 may perform the power up based refresh determination based on the identified candidate blocks (e.g., the open block 225, firmware block A, firmware block B, and firmware block C in example 500). This may be performed as described above in connection with reference number 415 of FIG. 4 and/or elsewhere herein.

As shown by reference number 520, the memory device 120 may determine, based on performing the power up based refresh determination, whether a candidate block (e.g., the open block 225, firmware block A, firmware block B, and firmware block C in example 500) satisfies one or more high priority refresh conditions. More particularly, as shown by reference number 525, the memory device 120 may determine, based on performing a power up based refresh determination, whether a candidate block satisfies a high priority age condition and/or a high priority temperature condition. Thus, in some implementations, a refresh condition includes a high priority age condition and/or a high priority temperature condition.

In some implementations, a high priority age condition may be based on a comparison of a high priority age threshold associated with the memory device 120 and a difference between a current time associated with a candidate block (described above) and an opening time associated with the candidate block (described above). In some implementations, a high priority age threshold associated with the memory device 120 may be a numerical value, such as a numerical value corresponding to a time period (e.g., a number of days or a number of months). In some implementations, a high priority age condition is satisfied if a difference between a current time and an opening time associated with the candidate block is greater than (or equal to) a high priority age threshold. In some implementations, a high priority age condition is not satisfied if a difference between a current time and an opening time associated with the candidate block is less than (or equal to) a high priority age threshold. Thus, for example, if a difference between a current time and an opening time associated with a candidate block is seven months, and a high priority age threshold is six months, then the memory device 120 may determine that the candidate block satisfies the high priority age condition (e.g., seven months is greater than six months).

In some implementations, a high priority temperature condition may be based on a comparison of a high priority temperature threshold associated with the memory device 120 and a difference between a current temperature associated with a candidate block (described above) and an opening temperature associated with the candidate block (described above). In some implementations, a high priority temperature condition is satisfied if a difference between a current temperature and an opening temperature associated with the candidate block is greater than (or equal to) a high priority temperature threshold. In some implementations, a high priority temperature condition is not satisfied if a difference between a current temperature and an opening temperature associated with the candidate block is less than (or equal to) a high priority temperature threshold. In some implementations, a high priority temperature threshold associated with the memory device 120 may be a numerical value, such as a numerical value corresponding to a temperature associated with the candidate block. For example, if a difference between a current temperature and an opening temperature associated with a candidate block is 80° C., and a high priority temperature threshold is 70° C., then the memory device 120 may determine that the candidate block satisfies the high priority temperature condition (e.g., 80° C. is greater than 70° C.).

As shown by reference number 530, the memory device 120 may store an indication of a high priority refresh (e.g., a high priority refresh indicator) for a candidate block that satisfies a high priority refresh condition. In the example 500, the memory device 120 stores, based on a determination that open block 225 satisfies a high priority refresh condition, a block identifier that identifies open block 225 and a refresh indicator (e.g., "high priority refresh") that indicates open block 225 is to be refreshed with high priority. In some implementations, if a refresh indicator indicates that a candidate block is to be refreshed with high priority, then the memory device 120 refrains from determining whether the candidate block satisfies any low priority refresh conditions (described below) and from storing any further indications associated with the candidate block. Thus, in some implementations, the memory device 120 refrains from performing an additional analysis operation on the candidate block. This saves time, conserves resources, and reduces latency for performing other memory operations as compared to determining whether a candidate block satisfies any low priority conditions after the memory device 120 determines that the candidate block satisfies a high priority age condition.

As shown by reference number 535, the memory device 120 may determine (e.g., if the high priority age condition and the high priority temperature condition are not satisfied for a candidate block), based on performing the power up based refresh determination, whether a candidate block (e.g., firmware block A, firmware block B, and firmware block C in example 500) satisfies one or more low priority refresh conditions.

More particularly, as shown by reference number 540, the memory device 120 may determine (e.g., if the high priority age condition and the high priority temperature condition are not satisfied for a candidate block), based on performing the power up based refresh determination, whether a candidate block satisfies a low priority age condition and/or a low priority temperature condition. Thus, in some implementations, a refresh condition includes a low priority age condition and/or a low priority temperature condition.

In some implementations, a low priority age condition may be based on a comparison of a low priority age threshold associated with the memory device 120 and a difference between a current time associated with a candidate block (described above) and an opening time associated with the candidate block (described above). In some implementations, a low priority age threshold associated with the memory device 120 may be a numerical value, such as a numerical value corresponding to a time period (e.g., a number of days or a number of months).

In some implementations, a high priority age threshold associated with a high priority age condition is a larger numerical value than a numerical value of a low priority age threshold associated with a low priority age condition. Thus, in some implementations, if a candidate block satisfies a high priority age condition, the candidate block also satisfies a low priority age condition. As such, in some implementations, the memory device 120 analyzes a candidate block to determine whether the candidate block satisfies a high priority age condition before analyzing the candidate block to determine whether the candidate block satisfies a low priority age condition. For example, if the memory device 120 determines that a candidate block satisfies a high priority age condition, the memory device 120 refrains from determining whether the candidate block satisfies a low priority age condition. Thus, in some implementations, the memory device 120 refrains from performing an additional analysis operation on the candidate block. This saves time, conserves resources, and reduces latency for performing other memory operations as compared to determining whether a candidate block satisfies a low priority age condition after the memory device 120 determines that the candidate block satisfies a high priority age condition.

In some implementations, a low priority age condition is satisfied if a difference between a current time and an opening time associated with the candidate block is greater than (or equal to) low priority age threshold. In some implementations, a low priority age condition is not satisfied if a difference between a current time and an opening time associated with the candidate block is less than (or equal to) a low priority age threshold. Thus, for example, if a difference between a current time and an opening time associated with a candidate block is two years, a high priority age threshold is three years, and a low priority age threshold is one year, then the memory device 120 may determine (e.g., after the memory device 120 determines that the candidate block does not satisfy the high priority age condition), that the candidate block satisfies the low priority age condition (e.g., two years is greater than one year).

In some implementations, a low priority temperature condition may be based on a comparison of a low priority temperature threshold associated with the memory device 120 and a difference between a current temperature associated with a candidate block (described above) and an opening temperature associated with the candidate block (described above). In some implementations, a low priority temperature threshold associated with the memory device 120 may be a numerical value, such as a numerical value range corresponding to a temperature range.

In some implementations, a low priority temperature threshold associated with a low priority temperature condition is a larger numerical value than a numerical value of a low priority temperature threshold associated with a low priority temperature condition. Thus, in some implementations, if a candidate block satisfies a high priority temperature condition, the candidate block also satisfies a low priority temperature condition. As such, in some implementations, the memory device 120 analyzes a candidate block to determine whether the candidate block satisfies a high priority temperature condition before analyzing the candidate block to determine whether the candidate block satisfies a low priority temperature condition. For example, if the memory device 120 determines that a candidate block satisfies a high priority temperature condition, the memory device 120 refrains from determining whether the candidate block satisfies a low priority temperature condition. Thus, in some implementations, the memory device 120 refrains from performing an additional analysis operation on the candidate block. This saves time, conserves resources, and reduces latency for performing other memory operations as compared to determining whether a candidate block satisfies a low priority temperature condition after the memory device 120 determines that the candidate block satisfies a high priority temperature condition.

In some implementations, a low priority temperature condition is satisfied if a difference between a current temperature and an opening temperature associated with the candidate block is greater than (or equal to) a low priority temperature threshold. In some implementations, a low priority temperature condition is not satisfied if a difference between a current temperature and an opening temperature associated with the candidate block is less than (or equal to) a low priority temperature threshold. Thus, for example, if a difference between a current temperature and an opening temperature associated with a candidate block is a temperature of 65° C., a high priority temperature threshold is 70° C., and a low priority temperature threshold is 60° C., then the memory device 120 may determine (e.g., after the memory device 120 determines that the candidate block does not satisfy the high priority temperature condition), that the candidate block satisfies the low priority temperature condition (e.g., 65° C. is greater than 60° C.).

As shown by reference number 545, the memory device 120 may store an indication of a low priority refresh (e.g., a low priority refresh indicator) for a candidate block that satisfies a low priority refresh condition. In the example 500, the memory device 120 stores, based on a determination that firmware block A satisfies a low priority refresh condition, a block identifier that identifies firmware block A and a refresh indicator (e.g., "low priority refresh") that indicates firmware block A is to be refreshed with low priority.

As shown by reference number 550, the memory device 120 may store an indication not to refresh a candidate block that does not satisfy any low priority refresh conditions (and that does not satisfy any high priority refresh conditions). In the example 500, the memory device 120 stores, based on a determination that firmware block B and firmware block C do not satisfy any low priority refresh conditions, a block identifier that identifies firmware block B, a refresh indicator (e.g., "no refresh") that indicates firmware block B is not to be refreshed, a block identifier that identifies firmware block C, and a refresh indicator (e.g., "no refresh") that indicates firmware block C is not to be refreshed.

As shown by reference number 555, the memory device 120 may refrain from refreshing a candidate block based on storing an indication that the candidate block is not to be refreshed. For example, the memory device 120 may refrain from refreshing a candidate block based on a block identifier identifying a candidate block and a refresh indicator indicating that the candidate block is not to be refreshed. In some cases, candidate blocks do not need to be refreshed (e.g., if data was recently programmed into the candidate block). Thus, refraining from refreshing a candidate block that does not need to be refreshed saves time and enables the memory device 120 to save time and conserve resources. In the example 500, the memory device 120 refrains from refreshing firmware block B and firmware block C based on the indication that firmware block B and firmware block C are not to be refreshed.

As shown by reference number 560, the memory device 120 may refresh a candidate block with high priority based on storing an indication that the candidate block is to be refreshed with high priority. For example, the memory device 120 may refresh, based on a block identifier identifying a candidate block and a refresh indicator indicating that the candidate block is to be refreshed with high priority, the candidate block with high priority by copying data (e.g., a portion of data or all data) stored in the candidate block to a new block, as described above in connection with FIG. 4. In some cases, a difference between a current time and an opening time and/or a difference between a current temperature and an opening temperature associated with a first candidate block that is to be refreshed is greater than (or equal to) a difference between a current time and an opening time and/or a difference between a current temperature and an opening temperature associated with a second candidate block that is to be refreshed.

For example, if a difference between a current time and an opening time associated with the first candidate block is three and a half years, a difference between a current time and an opening time associated with the second candidate block is one and a half years, a high priority age threshold associated with a high priority age condition is three years, and a low priority age threshold associated with a low priority age condition is one year, the memory device 120 may determine that the first candidate block is to be refreshed with high priority and the second candidate is to be refreshed with low priority. Thus, in some implementations, refreshing the first candidate block may be more critical than refreshing the second candidate block. As such, in some implementations, the memory device 120 may refresh, based on the first candidate block being more critical to refresh than the second candidate block, the first candidate block with high priority (e.g., before refreshing the second candidate block).

As shown by reference number 565, the memory device 120 may refresh a candidate block with low priority based on storing an indication that the candidate block is to be refreshed with low priority. For example, the memory device 120 may refresh, based on a block identifier identifying a candidate block and a refresh indicator indicating that the candidate block is to be refreshed with low priority, the candidate block with low priority by copying data (e.g., a portion of data or all data) stored in the candidate block to a new block, as described above in connection with FIG. 4. In some cases, a difference between a current time and an opening time and/or a difference between a current temperature and an opening temperature associated with a first candidate block that is to be refreshed is less than (or equal to) a difference between a current time and an opening time and/or a difference between a current temperature and an opening temperature associated with a second candidate block that is to be refreshed.

For example, if a difference between a current time and an opening time associated with the first candidate block is one and a half years, a difference between a current time and an opening time associated with the second candidate block is three and a half years, a high priority age threshold associated with a high priority age condition is three years, and a low priority age threshold associated with a low priority age condition is one year, the memory device 120 may determine that the first candidate block is to be refreshed with low priority and the second candidate is to be refreshed with high priority. Thus, in some implementations, refreshing the second candidate block may be more critical than refreshing the first candidate block. As such, in some implementations, the memory device 120 may refresh, based on the second candidate block being more critical to refresh than the first candidate block, the first candidate block with low priority (e.g., after refreshing the second candidate block).

Thus, in some implementations, the memory device 120 may refresh a first candidate block before refreshing one or more candidate blocks that are to be refreshed with low priority based on a determination that the first candidate block is to be refreshed with high priority, or refresh the first candidate block after refreshing one or more candidate blocks that are to be refreshed with high priority based on a determination that the first candidate block is to be refreshed with low priority.

In some implementations, the memory device 120 may identify a set of candidate blocks to be refreshed based on performing the power up based refresh determination. For example, the memory device 120 may perform a power up based refresh determination on a quantity of candidate blocks, and the memory device 120 may identify a set of candidate blocks of the quantity of candidate blocks to be refreshed based on performing a power up based refresh determination on the quantity of candidate blocks.

In some implementations, a corresponding age condition or a corresponding temperature condition is satisfied for each respective candidate block. In some implementations, a first age threshold and/or a second age threshold associated with the age condition may be based on an operating condition of the memory device (e.g., a temperature associated with the memory device 120, a number of program/erase (P/E) cycles associated with the memory device 120, and/or an error rate associated with the memory device 120). A program/erase cycle may refer to a cycle where a program operation is performed on a candidate block followed by an erase operation performed on the block. For example, a program/erase cycle may include programming a candidate block (e.g., writing data to the candidate block) and later erasing that candidate block (e.g., to enable writing of new data to the candidate block). Each program/erase operation associated with a program/erase cycle can degrade the candidate block. As such, repeated program/erase cycles can prevent the memory device 120 from meeting program and/or erase operation requirements and/or may prevent the memory device 120 from reading a correct data pattern associated with a candidate block. A bit error rate associated with the memory device 120 may refer to a number of incorrect bits in a data stream stored in the memory device 120. In some implementations, a first temperature threshold and/or a second temperature threshold associated with a temperature condition may be based on an operating condition of the memory device 120 (e.g., an age associated with the memory device 120, the number of program/erase cycles associated with the memory device 120, and/or the error rate associated with the apparatus).

Thus, in some implementations, the first age threshold, the second age threshold, the first temperature threshold, and/or the second temperature threshold may vary based on an operating condition of the memory device 120. For example, if a temperature associated with a candidate block is higher than a normal operating or storage temperature, data retention degradation effects and/or cross-temperature effects may impact the candidate block earlier than if the temperature associated with the candidate block is at a normal operating or storage temperature. As such, in some implementations, an age threshold (e.g., a first age threshold and/or a second age threshold) may be lowered. For example, as an age associated with a candidate block increases, the candidate block may be less reliable under temperature variation. Thus, in some limitations, as an age associated with a candidate block increases, a temperature threshold (e.g., a first temperature threshold and/or a second temperature threshold) may be lowered.

In some implementations, each candidate block, included in the set of candidate blocks, may satisfy one or more of a high priority refresh condition that is based on a block parameter of that candidate block satisfying a first threshold, or a low priority refresh condition that is based on the parameter of that candidate block satisfying a second threshold and not satisfying the first threshold.

In some implementations, a high priority refresh condition for a candidate block, included in the set of candidate blocks, may be based on an age parameter of the memory block satisfying a first age threshold, or a temperature parameter of the memory block satisfying a first temperature threshold. In some implementations, a low priority refresh condition for candidate block, included in the set of candidate blocks, may be based on an age parameter of the candidate block satisfying a second age threshold and not satisfying the first age threshold, or the temperature parameter of the candidate block satisfying a second temperature threshold and not satisfying the first temperature threshold.

In some implementations, the memory device 120 may store a set of indications, corresponding to the set of candidate blocks, that the set of candidate blocks is to be refreshed. In some implementations, the set of indications may include an indication, for each candidate block included in the set of candidate blocks, of a refresh priority level associated with that candidate block (e.g., a refresh indicator, such as "high priority refresh" or "low priority refresh"). In some implementations, the memory device 120 may refresh the set of candidate blocks based on the set of indications after the power up based refresh determination has been performed for the quantity of candidate blocks. For example, the memory device 120 may refresh each candidate block included in the set of candidate blocks based on whether that candidate block satisfies a high priority refresh condition or a low priority refresh condition such that every candidate block that satisfies the high priority refresh condition is refreshed before any candidate blocks that satisfy the low priority refresh condition are refreshed.

In some implementations, the memory device 120 may refresh a first candidate block of the set of candidate blocks before executing any host commands and before refreshing any candidate blocks of the set of candidate blocks associated with a low refresh priority level based on the first candidate block being associated with a high refresh priority level. In some implementations, the memory device 120 may refresh a first candidate block of the set of candidate blocks during an idle state of the memory device 120 and after refreshing all candidate blocks of the set of candidate blocks associated with the high refresh priority level based on the first candidate block being associated with the low refresh priority level.

As indicated above, FIG. 5 is provided as an example. Other examples may differ from what is described with regard to FIG. 5.

Figure 6:
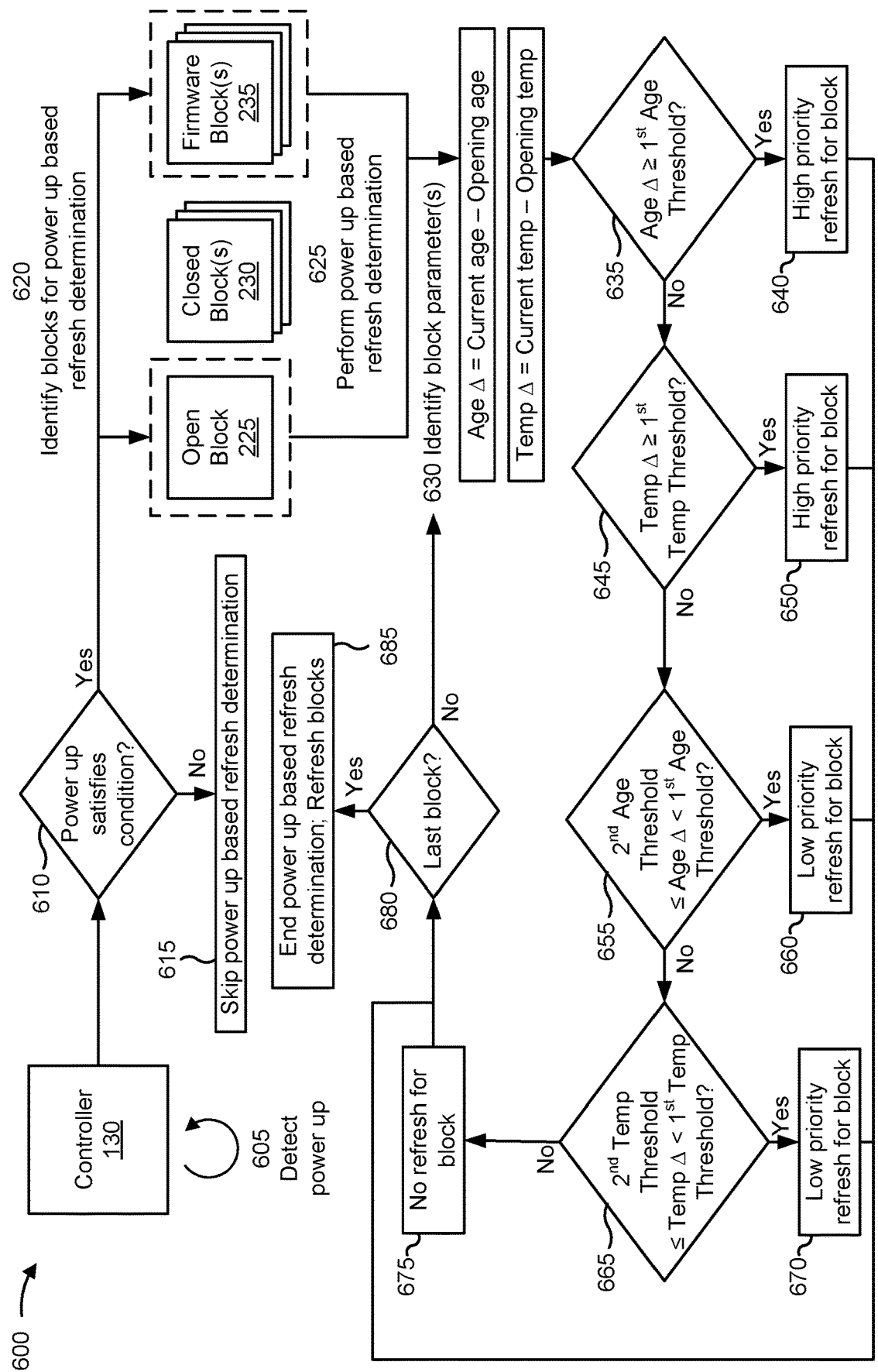

FIG. 6 is a diagram of an example 600 of refreshing a memory block on power up based on an age and/or temperature condition. The operations described in connection with FIG. 6 may be performed by the memory device 120 and/or one or more components of the memory device 120, such as the controller 130 and/or one or more components of the controller 130.

As shown by reference number 605, the memory device 120 may detect power up of the memory device 120. This may be performed as described above in connection with reference number 405 of FIG. 4 and/or elsewhere herein.

As shown by reference number 610, the memory device 120 may determine, based on detecting power up of the memory device 120, whether the power up of the memory device 120 satisfies a power up condition (e.g., one or more power up conditions) associated with the memory device 120. In some implementations, a power up condition may be based on a power up type associated with the memory device 120, such as an initial power up of the memory device 120 of a time period. For example, a power up type may be an initial power up of the memory device 120 of a day, of an hour, and/or of a week. As such, in some implementations, a power up condition based on a power up type may be satisfied if the power up of the memory device 120 is an initial power up during a time period (e.g., of a day) and not satisfied if the power up of the memory device 120 is not an initial power up during the time period (e.g., of a day). As an example, the power up condition is satisfied if the power up is a first power up of the day (or other time period, such as a week or a month), and the power up condition is not satisfied if the power up is a second or third power up of the day.

Additionally, or alternatively, a power up condition may be based on a power up threshold. In some implementations, a power up threshold may be based on a comparison of a power up threshold and a difference between a current power up time and a prior power up or power down time associated with the memory device 120. In some implementations, a power up condition is satisfied if a difference between a current power up time and a prior power up (or power down) time associated with the memory device 120 (e.g., a numerical difference between the current power up time and the prior power up time) is greater than (or equal to) a power up threshold. In some implementations, a power up condition is not satisfied if a difference between a current power up time and a prior power up (or power down) time associated with the memory device 120 is less than (or equal to) a power up threshold.

In some implementations, a current power up time may be associated with detecting a power up of the memory device 120. For example, a current power up time may be a time (e.g., a date or a date and a time of day) at which the power up of the memory device 120 is detected. In some implementations, a prior power up time may be associated with a prior power up of the memory device 120, and a prior power down time may be associated with a prior power down of the memory device 120. For example, a prior power up or power down time may be a time (e.g., a date or a date and time of day) at which the memory device 120 is powered up or powered down, respectively, that is prior to the current power up time. In some implementations, a power up threshold may be a numerical value, such as a numerical value corresponding to a number of days, a number of minutes, or a counter value.

For example, if the current power up time is a first date (e.g., Jan. 5, 2020) and a prior power up time is a second date (e.g., Jan. 1, 2020), a difference between the current power up time and the prior power up time is a difference between the first date and the second date (e.g., a difference between Jan. 1, 2020, and Jan. 5, 2020, is four days). Thus, in some implementations, a power up condition may be based on an elapsed time between a first power up and a second power up of the memory device 120 and/or an elapsed time period between a power down and a power up of the memory device 120. For example, if a difference between a current power up time and a prior power up time associated with the memory device 120 is four days, and a power up threshold is three days, the memory device 120 may determine that the power up condition is satisfied (e.g., four days is greater than three days).

In some cases, a power up based refresh determination may not need to be performed (e.g., when a recent power up based refresh determination has been performed). Thus, determining whether a power up condition associated with the memory device 120 enables the memory device 120 to determine whether a power up based refresh determination is to be performed, as described in more detail elsewhere herein.

As shown by reference number 615, the memory device 120 may skip (e.g., not perform or refrain from performing) a power up based refresh determination based on the power up condition not being satisfied. For example, if a difference between a current power up time and a prior power up time associated with the memory device 120 is four days, and a power up threshold is five days, the memory device 120 may determine that the power up condition is not satisfied (e.g., four days is less than five days). Alternatively, the memory device 120 may skip the power up based refresh determination for all power ups other than the initial power up during a time period (e.g., a day, a week, or a month). Skipping a power up based refresh determination based on the power up condition not being satisfied enables the memory device 120 to save time and conserve resources.

As shown by reference number 620, the memory device 120 may identify, based on determining that the power up of the memory device 120 satisfies a power up condition, a candidate block (e.g., one or more open blocks 225, closed blocks, and/or firmware blocks 235) of the memory device 120 for which a power up based refresh determination is to be performed. This may be performed as described above in connection with reference number 410 of FIG. 4 and/or elsewhere herein.

As shown by reference number 625, the memory device 120 may perform the power up based refresh determination on a current candidate block. In some implementations, a current candidate block is a candidate block of the identified candidate blocks that is to be analyzed by the memory device 120. For example, if the memory device 120 identifies an open block 225 and a firmware block 235 as candidate blocks for which a power up based determination is to be performed, and if the memory device 120 analyzes the open blocks 225 before firmware blocks 235, the open block 225 is a current candidate block when the memory device 120 is analyzing the open block 225. In some implementations, after the memory device 120 analyzes the open block 225, the memory device 120 analyzes the firmware block 235, and the firmware block 235 is a current candidate block when the memory device 120 is analyzing the firmware block 235. The power up based refresh determination may be performed on the current candidate block by analyzing the current candidate block (as described below) to determine whether the current candidate block is to be refreshed. For example, performing the power up based refresh determination for a current candidate block may include analyzing a block parameter (e.g., one or more parameters of a first candidate block) to determine whether a refresh condition is satisfied for a current candidate block, as described below.

As shown by reference number 630, the memory device 120 may identify, based on performing a power up based refresh determination, a block parameter of a current candidate block. In some implementations, a block parameter may include an age parameter and/or a temperature parameter of a current candidate block. In some implementations, an age parameter of a block may be (or may be based on) a difference between a current time associated with the current candidate block (described above) and an opening time associated with the current candidate block (described above). In some implementations, a temperature parameter of a current candidate block may be (or may be based on) a difference between a current temperature associated with a current candidate block (described above) and an opening temperature associated with the current candidate block (described above).

As shown by reference number 635, the memory device 120 may determine, based on identifying an age parameter of a current candidate block, whether the current candidate block satisfies a first age condition (e.g., a high priority refresh condition). In some implementations, a first age condition may be based on a comparison of a first age threshold associated with the memory device 120 and an age parameter (described above).

In some implementations, a first age threshold may be a numerical value, such as a numerical value corresponding to a time period (e.g., a number of days or a number of months). For example, a first age threshold may be based on a maximum data retention time of the memory device 120. A maximum data retention time of the memory device 120 refers to a maximum time period that the memory device 120 is capable of retaining data at a specified storage temperature when the memory device 120 is powered off. For example, if a maximum data retention time associated with a memory device 120 is one year at a specified storage temperature of 40° C., the memory device 120 is capable of retaining data for one year at a storage temperature of 40° C. when the memory device 120 is powered off.

In some implementations, a first age threshold may be equal to (or based on) half of a specified time period of a maximum data retention time of the memory device 120. For example, if a specified time period of a maximum data retention time of the memory device 120 is twelve months, half of the specified time period of the maximum data retention time of the memory device 120 is six months. Thus, in some implementations, the memory device 120 may determine, based on identifying an age parameter of a current candidate block, whether a current candidate block satisfies a first age condition based on a comparison of a first age threshold and an age parameter of the current candidate block. In some implementations, a first age condition satisfied if an age parameter of the current candidate block is greater than (or equal to) the first age threshold (e.g., the age parameter of the current candidate block satisfies the first age threshold). In some implementations, a first age condition is not satisfied if an age parameter of the current candidate block is less than (or equal to) the first age threshold (e.g., the age parameter of the current candidate block does not satisfy the first age threshold). Thus, for example, if an age parameter of the current candidate block is seven months, and a first age threshold is six months (e.g., half of a specified time period of a maximum data retention time of the memory device 120), then the memory device 120 may determine that the current candidate block satisfies the first age condition (e.g., seven months is greater than six months). In the example 600, if the memory device 120 determines that the current candidate block satisfies the first age condition, then the memory device 120 performs operations associated with reference number 640 of FIG. 6, as described below. In the example 600, if the memory device 120 determines that the current candidate block does not satisfy the first age condition, then the memory device 120 performs operations associated with reference number 645 of FIG. 6, as described below.

As shown by reference number 640, the memory device 120 may store an indication of a high priority refresh for a current candidate block that satisfies a first age condition. For example, the memory device 120 may store, based on a determination that a candidate block satisfies a first age condition, a block identifier that identifies the current candidate block and a refresh indicator (e.g., "high priority refresh") that indicates that the current candidate block is to be refreshed with high priority. After storing the indication, the memory device 120 may determine whether the current candidate block is a last candidate block for which a power up based refresh determination is to be performed, as described below in connection with reference number 680.

As shown by reference number 645, the memory device 120 may determine (e.g., if the first age condition is not satisfied for the current candidate block), based on identifying a temperature parameter of a current candidate block, whether the current candidate block satisfies a first temperature condition. In some implementations, a first temperature condition may be based on a comparison of a first temperature threshold associated with the memory device 120 and a temperature parameter of the current candidate block (described above). For example, a first temperature threshold may be based on a maximum cross-temperature delta (e.g., maximum change between a temperature at which a write operation is performed by the memory device 120 and a temperature at which a read operation is performed by the memory device 120) that allows reliable read operations to be performed by the memory device 120.

Thus, in some implementations, the memory device 120 may determine, based on identifying a temperature parameter of a current candidate block, whether a current candidate block satisfies a first temperature condition based on a comparison of a first temperature threshold and a temperature parameter of the current candidate block. In some implementations, a first temperature condition is satisfied if a temperature parameter of the current candidate block is greater than (or equal to) the first temperature threshold (e.g., the temperature parameter of the current candidate block satisfies the first temperature threshold). In some implementations, a first temperature condition is not satisfied if a temperature parameter of a current candidate block is less than (or equal to) the first temperature threshold (e.g., the temperature parameter of the current candidate block does not satisfy the first temperature threshold). Thus, for example, if a temperature parameter of a current candidate block is 80° C., and a first temperature threshold is 70° C. (e.g., a maximum cross-temperature that allows reliable read operations to be performed by the memory device 120 is 70° C.), the memory device 120 may determine that the current candidate block satisfies the first temperature condition (e.g., 80° C. is greater than 70° C.).

In the example 600, if the memory device 120 determines that the current candidate block satisfies the first temperature condition, then the memory device 120 performs operations associated with reference number 650 of FIG. 6, as described below. In the example 600, if the memory device 120 determines that the current candidate block does not satisfy the first temperature condition, then the memory device 120 performs operations associated with reference number 655 of FIG. 6, as described below. Further, while the memory device 120 is described as performing operations associated with reference number 635 of FIG. 6 before performing operations associated with reference number 645 of FIG. 6, in some implementations, the memory device 120 may perform operations associated with reference number 645 of FIG. 6 before performing operations associated with reference number 635. In other words, example 600 shows the memory device 120 determining whether the first age condition is satisfied and then determining whether the first temperature condition is satisfied only if the first age condition is not satisfied. However, in some implementations, the memory device 120 may determine whether the first temperature condition is satisfied and may then determine whether the first age condition is satisfied only if the first temperature condition is not satisfied.

As shown by reference number 650, the memory device 120 may store an indication of a high priority refresh for a current candidate block that satisfies a first temperature condition. For example, the memory device 120 may store, based on a determination that a current candidate block satisfies a first temperature condition, a block identifier that identifies the current candidate block and a refresh indicator (e.g., "high priority refresh") that indicates the current candidate block is to be refreshed with high priority. After storing the indication, the memory device 120 may determine whether the current candidate block is a last candidate block for which a power up based refresh determination is to be performed, as described below in connection with reference number 680.

As shown by reference number 655, the memory device 120 may determine (e.g., if the first age condition and the first temperature condition are not satisfied for the current candidate block), based on identifying an age parameter of a current candidate block, whether the current candidate block satisfies a second age condition. In some implementations, a second age condition may be based on a comparison of a second age threshold associated with the memory device 120 and an age parameter (described above). In some implementations, a second age threshold associated with the memory device 120 may be a numerical value, such as a numerical value corresponding to a time period (e.g., a number of days or a number of months). In some implementations, the second age threshold is less than the first age threshold In some implementations, a second age threshold may be equal to (or based on) a quarter (¼) of the specified time period of a maximum data retention time of the memory device 120. For example, if a specified time period of a maximum data retention time of the memory device 120 is twelve months, a quarter of the specified time period of the maximum data retention time of the memory device 120 is three months. Thus, in some implementations, the memory device 120 may determine, based on identifying an age parameter of a current candidate block, whether a current candidate block satisfies a second age condition based on a comparison of a second age threshold and an age parameter of the current candidate block. In some implementations, a second age condition satisfied if an age parameter of the current candidate block is greater than (or equal to) the second age threshold (e.g., the age parameter of the current candidate block satisfies the second age threshold). In some implementations, a second age condition is not satisfied if an age parameter of the current candidate block is less than (or equal to) the second age threshold (e.g., the age parameter of the current candidate block does not satisfy the second age threshold). Thus, for example, if an age parameter of the current candidate block is five months, and a second age threshold is three months (e.g., a quarter of a specified time period of a maximum data retention time of the memory device 120), then the memory device 120 may determine that the current candidate block satisfies the second age condition (e.g., five months is greater than three months).

In the example 600, if the memory device 120 determines that the current candidate block satisfies the second age condition, the memory device 120 performs operations associated with reference number 660 of FIG. 6, as described below. In the example 600, if the memory device 120 determines that the current candidate block does not satisfy the second age condition, the memory device 120 performs operations associated with reference number 665 of FIG. 6, as described below.

As shown by reference number 660, the memory device 120 may store an indication of a low priority refresh for a current candidate block that satisfies a second age condition. For example, the memory device 120 may store, based on a determination that a current candidate block satisfies a second age condition, a block identifier that identifies the current candidate block and a refresh indicator (e.g., "low priority refresh") that indicates the current candidate block is to be refreshed with low priority. After storing the indication, the memory device 120 may determine whether the current candidate block is a last candidate block for which a power up based refresh determination is to be performed, as described below in connection with reference number 680.

As shown by reference number 665, the memory device 120 may determine (e.g., if the first age condition, the first temperature condition, and the second age condition are not satisfied for the current candidate block), based on identifying a temperature parameter of a current candidate block, whether the current candidate block satisfies a second temperature condition. In some implementations, a second temperature condition may be based on a comparison of a second temperature threshold associated with the memory device 120 and a temperature parameter of the current candidate block (described above). In some implementations, a second temperature threshold may be based on a maximum cross-temperature delta (described above) and a modifier, such as a subtracted temperature value. For example, if a maximum cross-temperature delta is 70° C., and a subtracted temperature value is 20° C., then the second temperature threshold is a temperature of 50° C. (e.g., 70° C. minus 20° C. equals 50° C.). In some implementations, the second temperature threshold is less than a first temperature threshold.

Thus, in some implementations, the memory device 120 may determine, based on identifying a temperature parameter of a current candidate block, whether a current candidate block satisfies a second temperature condition based on a comparison of a second temperature threshold and a temperature parameter of the current candidate block. In some implementations, a second temperature condition is satisfied if a temperature parameter of the current candidate block is greater than (or equal to) the second temperature threshold (e.g., the temperature parameter of the current candidate block satisfies the second temperature threshold). In some implementations, a second temperature condition is not satisfied if a temperature parameter of a current candidate block is less than (or equal to) the second temperature threshold (e.g., the temperature parameter of the current candidate block does not satisfy the second temperature threshold). Thus, for example, if a temperature parameter of a current candidate block is 60° C., and a second temperature threshold is 50° C., then the memory device 120 may determine that the current candidate block satisfies the second temperature condition (e.g., 60° C. is greater than 50° C.).

In the example 600, if the memory device 120 determines that the current candidate block satisfies the second temperature condition, the memory device 120 performs operations associated with reference number 670 of FIG. 6, as described below. In the example 600, if the memory device 120 determines that the current candidate block does not satisfy the second temperature condition, the memory device 120 performs operations associated with reference number 675 of FIG. 6, as described below.

Further, while the memory device 120 is described as performing operations associated with reference number 655 of FIG. 6 before performing operations associated with reference number 665 of FIG. 6, in some implementations, the memory device 120 may perform operations associated with reference number 665 of FIG. 6 before performing operations associated with reference number 655. In other words, example 600 shows the memory device 120 determining whether the second age condition is satisfied and then determining whether the second temperature condition is satisfied only if the second age condition is not satisfied. However, in some implementations, the memory device 120 may determine whether the second temperature condition is satisfied and may then determine whether the second age condition is satisfied only if the second temperature condition is not satisfied.

As shown by reference number 670, the memory device 120 may store an indication of a low priority refresh for a current candidate block that satisfies a second temperature condition. For example, the memory device 120 may store, based on a determination that a current candidate block satisfies a second temperature condition, a block identifier that identifies the current candidate block and a refresh indicator (e.g., "low priority refresh") that indicates the current candidate block is to be refreshed with low priority. After storing the indication, the memory device 120 may determine whether the current candidate block is a last candidate block for which a power up based refresh determination is to be performed, as described below in connection with reference number 680.

While the memory device 120 is described as performing operations associated with reference number 635, 645, 655, and 665 of FIG. 6, in some implementations, the memory device 120 may only perform operations associated with reference number 635 and 655 of FIG. 6. In other words, example 600 shows the memory device 120 determining whether the first age condition is satisfied, then determining whether the first temperature condition is satisfied only if the first age condition is not satisfied, then determining whether the second age condition is satisfied only if the first age condition and the first temperature condition are not satisfied, and then determining whether the second temperature condition is satisfied only if the first age condition, the first temperature condition, and the second age condition are not satisfied. However, in some implementations, the memory device 120 may determine whether the first age condition is satisfied, and then determine whether the second age condition is satisfied only if the first age condition is not satisfied (e.g., the memory device 120 refrains from determining whether the first temperature condition and the second temperature condition are satisfied).

While the memory device 120 is described as performing operations associated with reference number 635, 645, 655, and 665 of FIG. 6, in some implementations, the memory device 120 may only perform operations associated with reference number 645 and 665 of FIG. 6. In other words, example 600 shows the memory device 120 determining whether the first age condition is satisfied, then determining whether the first temperature condition is satisfied only if the first age condition is not satisfied, then determining whether the second age condition is satisfied only if the first age condition and the first temperature condition are not satisfied, and then determining whether the second temperature condition is satisfied only if the first age condition, the first temperature condition, and the second age condition are not satisfied. However, in some implementations, the memory device 120 may determine whether the first temperature condition is satisfied, and then determine whether the second temperature condition is satisfied only if the first temperature condition is not satisfied (e.g., the memory device 120 refrains from determining whether the first age condition and the second age condition are satisfied).

As shown by reference number 675, the memory device 120 may store an indication not to refresh a current candidate block that does not satisfy the second temperature condition (e.g., and does not satisfy any refresh conditions). For example, the memory device 120 may store, based on a determination that a current candidate block does not satisfy a second temperature condition, a block identifier that identifies the current candidate block and a refresh indicator (e.g., "no refresh") that indicates the current candidate block is not to be refreshed.

As shown by reference number 680, after storing the indication, the memory device 120 may determine whether the current candidate block is a last candidate block for which a power up based refresh determination is to be performed. In some implementations, a last candidate block is a remaining candidate block of the identified candidate blocks that is analyzed by the memory device 120. For example, if the memory device 120 identifies an open block 225 and a firmware block 235 as candidate blocks for which a power up based determination is to be performed, and if the firmware block 235 is a current candidate block (e.g., currently being analyzed by the memory device 120) and the open block 225 has already been analyzed by the memory device 120, the firmware block is a last candidate block.

For example, if the memory device 120 identifies an open block 225 and a firmware block 235 as candidate blocks for which a power up based determination is to be performed, and if the open block 225 is a current candidate block (e.g., currently being analyzed by the memory device 120) and the open firmware block 235 has not been analyzed by the memory device 120, the open block 225 is not a last candidate block. In the example 600, if the memory device 120 determines that the current candidate block is a last candidate block, the memory device 120 performs operations associated with reference number 685 of FIG. 6, as described below. In the example 600, if the memory device 120 determines that the current candidate block is not a last candidate block, the memory device 120 performs operations associated with reference number 630 of FIG. 6 on a next candidate block of the identified candidate blocks (e.g., until all candidate blocks have been analyzed).

As shown by reference number 685, the memory device 120 may refrain, based on determining whether the current candidate block is a last candidate block for which a power up based refresh determination is to be performed, from performing a next power up based refresh determination. For example, if the current candidate block being analyzed is a last candidate block, the memory device 120 may refrain from performing a next power up based refresh determination as all candidate blocks have been analyzed.

As further shown by reference number 685, the memory device 120 may refresh, based on storing an indication that the candidate block is to be refreshed with a priority level, a candidate block with a priority level (e.g., high priority or low priority). For example, each candidate block analyzed by the memory device 120 that satisfies at least one refresh condition (e.g., a first age condition, a first temperature condition, a second age condition, and/or a second temperature condition) may be refreshed with a corresponding priority level (high priority or low priority). For example, the memory device 120 may refresh a candidate block before refreshing one or more candidate blocks based on a determination that the candidate block is to be refreshed with high priority, or refresh the candidate block after refreshing one or more candidate blocks that are to be refreshed with high priority based on a determination that the candidate block is to be refreshed with low priority. Thus, in some implementations, the memory device 120 may refresh each candidate block analyzed by the memory device 120 that satisfies at least one high priority refresh condition before refreshing each candidate block analyzed by the memory device 120 that satisfies at least one low priority refresh condition.

In some implementations, the memory device 120 may identify a portion or all blocks of the memory device 120 as candidate blocks to be analyzed during the power up based refresh determination and may refresh each block analyzed by the memory device 120 that satisfies at least one refresh condition. In some cases, some blocks of the memory device 120 do not need to be refreshed and/or some blocks may be more critical to update than other blocks. Thus, performing a power up based refresh determination only on identified candidate blocks saves time and conserves resources and refreshing, if necessary, identified candidate blocks with corresponding priorities enables refreshing identified candidate blocks that are more critical to be refreshed than other blocks.

As indicated above, FIG. 6 is provided as an example. Other examples may differ from what is described with regard to FIG. 6.

Figure 7:
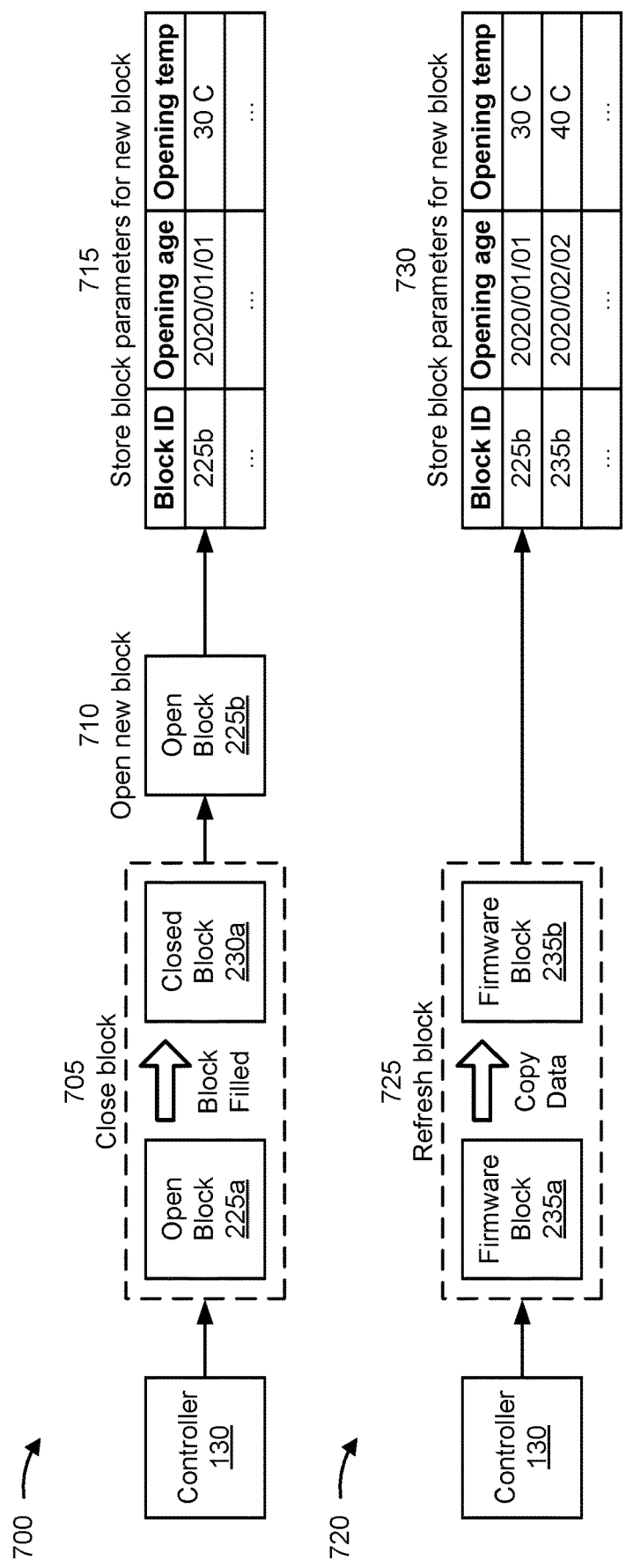
FIG. 7 is a diagram of example operations associated with storing block parameters.

FIG. 7 is a diagram of example operations 700 and 720 associated with storing block parameters. The example operations 700 and 720 described in connection with FIG. 7 may be performed by the memory device 120 and/or one or more components of the memory device 120, such as the controller 130 and/or one or more components of the controller 130.

As shown by reference number 705, in example operation 700, the memory device 120 may close an open block 225. For example, the memory device 120 may close an open block 225 that is filled (e.g., all pages have been written or a threshold quantity of pages have been written). When the open block 225 is closed, the open block 225 transitions to a closed block 230. In the example operation 700, the memory device 120 closes open block 225*a* when open block 225*a* is filled (e.g., all pages of open block 225*a* have been written or a threshold quantity of pages have been written) such that open block 225*a* transitions to closed block 230*a*.

As shown by reference number 710, in example operation 700, the memory device 120 may open a new block. For example, the memory device 120 may prepare the new block for writing and/or may perform a write operation to write data to a page of a new block (e.g., an open block 225 that includes one or more writable pages). The memory device 120 may determine a block parameter of the new block, such as a block identifier that identifies the new block, an opening time, such as an opening age, of the new block, and/or an opening temperature of the new block. In the example operation 700, the memory device opens new block 225*b* (e.g., to write data to a writable page of open block 225*b*) and determines a block identifier that identifies open block 225*b* as "225*b*," an opening time (e.g., opening age) indicated as "2020/01/01", and an opening temperature indicated as "30° C."

As shown by reference number 715, in example operation 700, the memory device 120 may store, based on determining a block parameter (e.g., a block identifier, an opening time, and/or an opening temperature) of a new block, a block parameter of the new block in an entry of a data structure, such as an lookup table. In the example operation 700, the memory device 120 stores, based on determining a block parameter of the new block, the block identifier indicated as "225*b*," the opening time (e.g., opening age) indicated as "2020/01/01," and the opening temperature indicated as "30° C." in an entry of a lookup table including columns entitled "Block ID," "Opening age," and "Opening temp," respectively. Thus, in some implementations, the data structure may store an entry corresponding to a block (e.g., one or more blocks). In some implementations, the entry of the data structure may identify a block, a corresponding opening time associated with the block, and a corresponding opening temperature associated with the block. Thus, in some implementations, the memory device 120 may identify the opening time and the opening temperature based on the block and based on a data structure stored in memory of the memory device.

As shown by reference number 725, in example operation 720, the memory device 120 may refresh a block. For example, the memory device 120 may copy data stored in the block to a new block, determine a new opening time and a new opening temperature associated with the new block, and store information that identifies the new block, the new opening time, and the new opening temperature in an entry of a data structure. For example, the memory device 120 may determine a block parameter of the new block, such as a block identifier that identifies the new block, an opening time of the new block, and/or an opening temperature of the new block. In the example operation 720, the memory device 120 refreshes a first firmware block 235*a* (shown as Firmware Block A) by copying data stored in Firmware Block A to a second firmware block 235*b* (shown as Firmware Block B) and determines a block identifier that identifies Firmware Block B as "235*b*," an opening time (e.g., opening age) indicated as "2020/02/02", and an opening temperature indicated as "40° C."

As shown by reference number 730, in example operation 720, the memory device 120 may store, based on determining a block parameter (e.g., a block identifier, an opening time, and/or an opening temperature) of a block, a block parameter in an entry of a data structure, such as an lookup table. In the example operation 720, the memory device 120 stores, based on determining a block parameter of the Firmware Block B, the block identifier indicated as "235b," the opening time (e.g., opening age) indicated as "2020/02/02," and the opening temperature indicated as "40° C." in another entry of the lookup table described above.

As indicated above, FIG. 7 is provided as an example. Other examples may differ from what is described with regard to FIG. 7.

Figure 8:
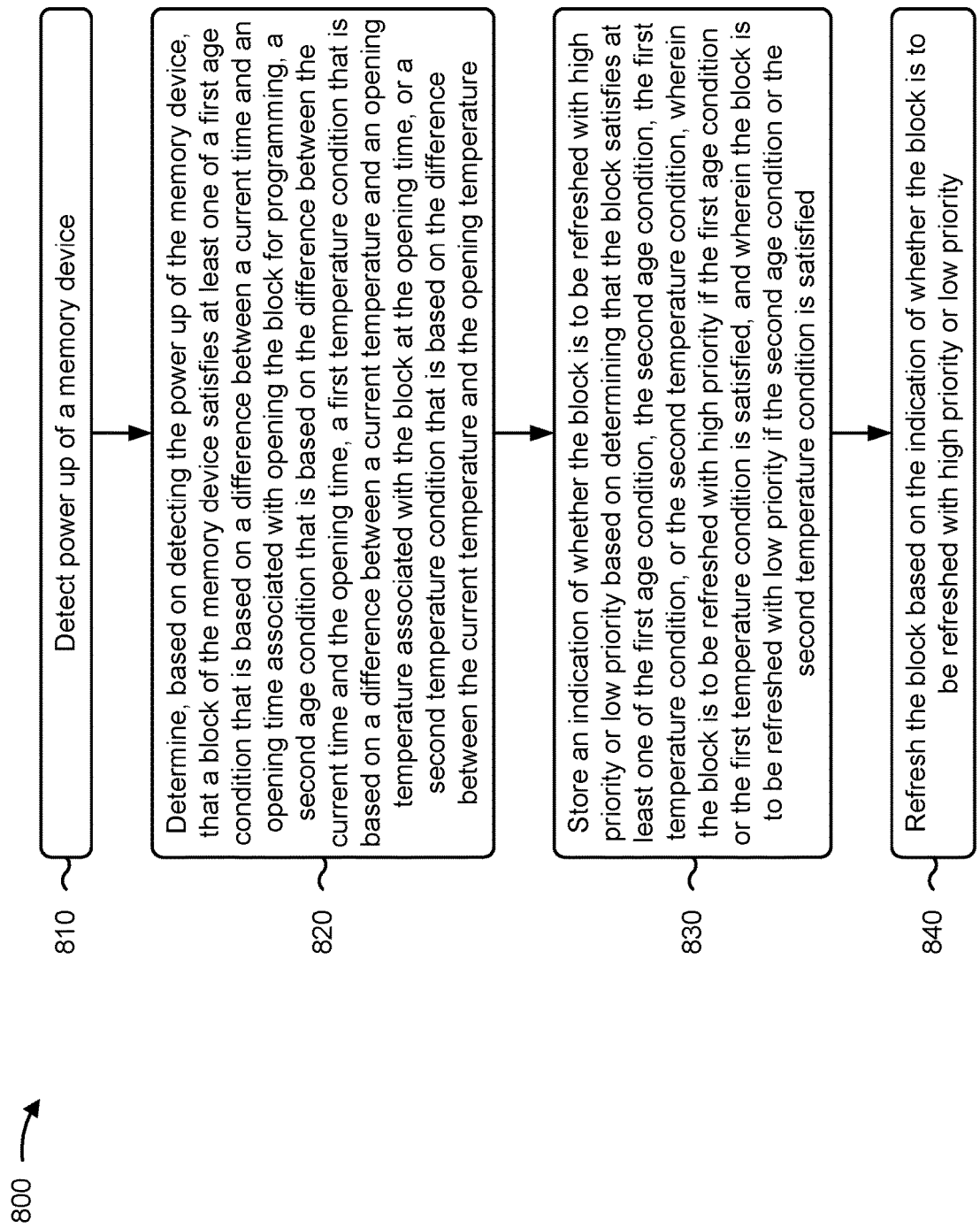
FIGS. 8-10 are flowcharts of example methods associated with refreshing a memory block on power up based on an age and/or temperature condition.

FIG. 8 is a flowchart of an example method 800 associated with refreshing a memory block on power up based on an age and/or temperature condition. In some implementations, a memory device (e.g., the memory device 120) may perform or may be configured to perform the method 800. In some implementations, another device or a group of devices separate from or including the memory device (e.g., the system 100) may perform or may be configured to perform the method 800. Additionally, or alternatively, one or more components of the memory device (e.g., the controller 130, the memory management component 240, the condition determination component 245, the indication storage component 250, the block refresh component 255, the age tracking component 260, and/or the temperature sensor 265) may perform or may be configured to perform the method 800. Thus, means for performing the method 800 may include the memory device and/or one or more components of the memory device. Additionally, or alternatively, a non-transitory computer-readable medium may store one or more instructions that, when executed by the memory device (e.g., the controller 130 of the memory device 120), cause the memory device to perform the method 800.

As shown in FIG. 8, the method 800 may include detecting power up of a memory device (block 810). As further shown in FIG. 8, the method 800 may include determining, based on detecting the power up of the memory device, that a block of the memory device satisfies at least one of a first age condition that is based on a difference between a current time and an opening time associated with opening the block for programming, a second age condition that is based on the difference between the current time and the opening time, a first temperature condition that is based on a difference between a current temperature and an opening temperature associated with the block at the opening time, or a second temperature condition that is based on the difference between the current temperature and the opening temperature (block 820). As further shown in FIG. 8, the method 800 may include storing an indication of whether the block is to be refreshed with high priority or low priority based on determining that the block satisfies at least one of the first age condition, the second age condition, the first temperature condition, or the second temperature condition, wherein the block is to be refreshed with high priority if the first age condition or the first temperature condition is satisfied, and wherein the block is to be refreshed with low priority if the second age condition or the second temperature condition is satisfied (block 830). As further shown in FIG. 8, the method 800 may include refreshing the block based on the indication of whether the block is to be refreshed with high priority or low priority (block 840).

The method 800 may include additional aspects, such as any single aspect or any combination of aspects described below and/or described in connection with one or more other methods or operations described elsewhere herein.

In a first aspect, the first age condition is that the difference between the current time and the opening time satisfies a first age threshold, the second age condition is that the difference between the current time and the opening time satisfies a second age threshold and does not satisfy the first age threshold, the first temperature condition is that the difference between the current temperature and the opening temperature satisfies a first temperature threshold, and the second temperature condition is that the difference between the current temperature and the opening temperature satisfies a second temperature threshold and does not satisfy the first temperature threshold.

In a second aspect, alone or in combination with the first aspect, the method 800 includes determining whether the block satisfies a first one of the first age condition or the first temperature condition, determining whether the block satisfies a second one of the first age condition or the first temperature condition only if the block does not satisfy the first one of the first age condition or the first temperature condition, determining whether the block satisfies a first one of the second age condition or the second temperature condition only if the block does not satisfy the first one of the first age condition or the first temperature condition and does not satisfy the second one of the first age condition or the first temperature condition, and determining whether the block satisfies a second one of the second age condition or the second temperature condition only if the block does not satisfy the first one of the second age condition or the second temperature condition, does not satisfy the first one of the first age condition or the first temperature condition, and does not satisfy the second one of the first age condition or the first temperature condition.

In a third aspect, alone or in combination with one or more of the first and second aspects, the opening time is one of a time at which the block is configured for writing of initial data to the block, a time at which the block is assigned a host-addressable address, a time at which initial data is programmed to the block, or a time at which data is programmed to the block after erasing the block.

In a fourth aspect, alone or in combination with one or more of the first through third aspects, the method 800 includes detecting that the power up of the memory device is an initial power up of a time period or that a threshold amount of time has elapsed since a prior power up or a prior power down, and wherein the one or more components, to determine that the block of the memory device satisfies at least one of the first age condition, the second age condition, the first temperature condition, or the second temperature condition, are configured to determining that the block of the memory device satisfies at least one of the first age condition, the second age condition, the first temperature condition, or the second temperature condition based on detecting that the power up of the memory device is the initial power up of the time period or that the threshold amount of time has elapsed since the prior power up or the prior power down.

In a fifth aspect, alone or in combination with one or more of the first through fourth aspects, the block is a host-addressable user data block that is partially written, or a non-host addressable block that stores firmware.

In a sixth aspect, alone or in combination with one or more of the first through fifth aspects, the one or more components are further configured to identify the opening time and the opening temperature based on the block and based on a data structure stored in memory of the memory device, wherein the data structure stores a plurality of entries corresponding to a plurality of blocks, including the block, of the memory device, and wherein each entry, of the plurality of entries, identifies a respective block, a corresponding opening time associated with the respective block, and a corresponding opening temperature associated with the respective block.

In a seventh aspect, alone or in combination with one or more of the first through sixth aspects, the method 800 includes copying data stored in the block to a new block, determining a new opening time and a new opening temperature associated with the new block, and storing information that identifies the new block, the new opening time, and the new opening temperature in an entry of a data structure.

In an eighth aspect, alone or in combination with one or more of the first through seventh aspects, the method 800 includes erasing the block, determining an updated time and an updated temperature associated with the block after erasing the block and in connection with writing new data to the block after the block has been erased, and updating an entry of the data structure, associated with the block, to indicate that the block is associated with the updated time and the updated temperature.

In a ninth aspect, alone or in combination with one or more of the first through eighth aspects, the method 800 includes refreshing the block before refreshing one or more blocks that are to be refreshed with low priority based on a determination that the block is to be refreshed with high priority, or refreshing the block after refreshing one or more blocks that are to be refreshed with high priority based on a determination that the block is to be refreshed with low priority.

Although FIG. 8 shows example blocks of a method 800, in some implementations, the method 800 may include additional blocks, fewer blocks, different blocks, or differently arranged blocks than those depicted in FIG. 8. Additionally, or alternatively, two or more of the blocks of the method 800 may be performed in parallel. The method 800 is an example of one method that may be performed by one or more devices described herein. These one or more devices may perform or may be configured to perform one or more other methods based on operations described herein.

Figure 9:
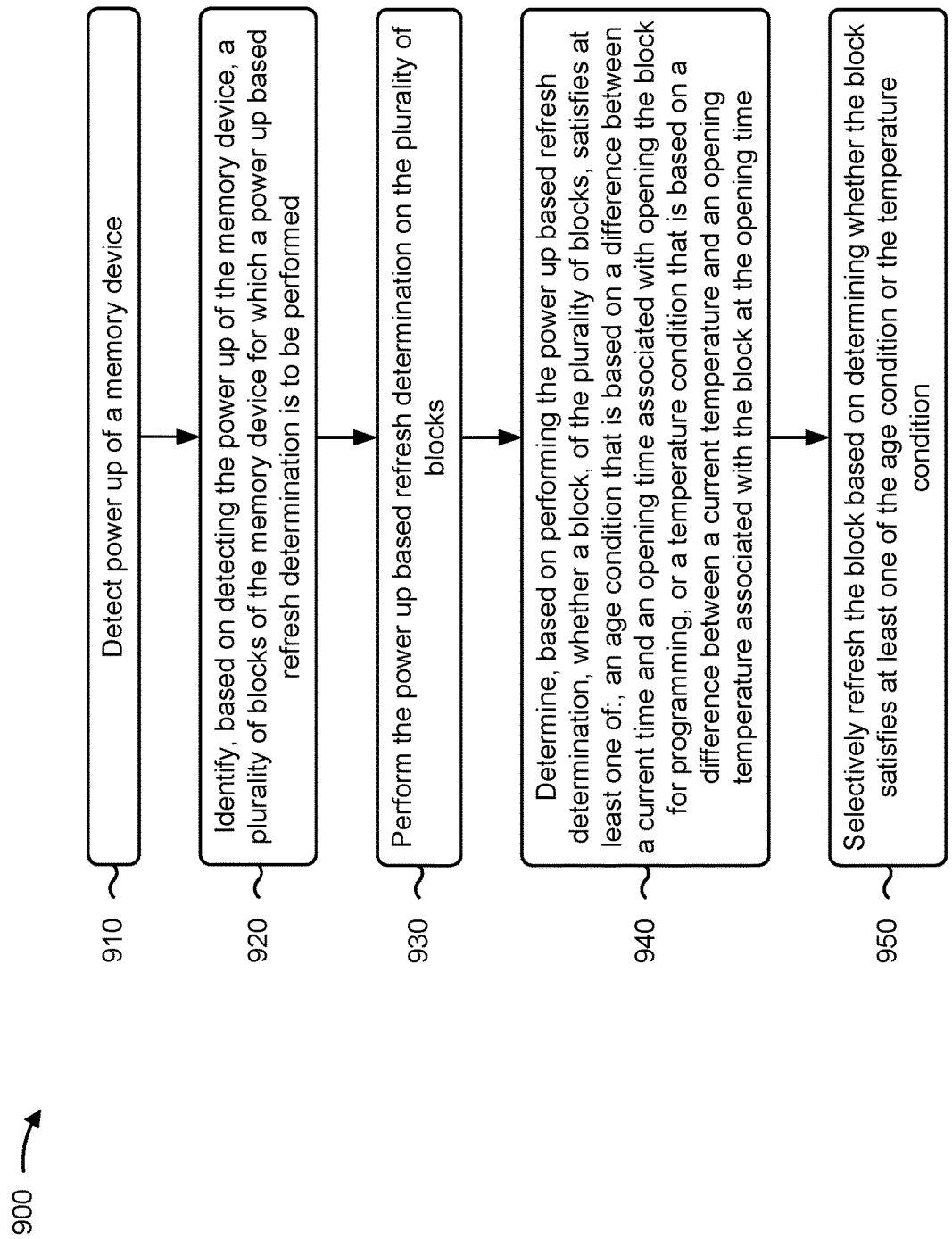

FIG. 9 is a flowchart of an example method 900 associated with refreshing a memory block on power up based on an age and/or temperature condition. In some implementations, a memory device (e.g., the memory device 120) may perform or may be configured to perform the method 900. In some implementations, another device or a group of devices separate from or including the memory device (e.g., the system 100) may perform or may be configured to perform the method 900. Additionally, or alternatively, one or more components of the memory device (e.g., the controller 130, the memory management component 240, the condition determination component 245, the indication storage component 250, the block refresh component 255, the age tracking component 260, and/or the temperature sensor 265) may perform or may be configured to perform the method 900. Thus, means for performing the method 900 may include the memory device and/or one or more components of the memory device. Additionally, or alternatively, a non-transitory computer-readable medium may store one or more instructions that, when executed by the memory device (e.g., the controller 130 of the memory device 120), cause the memory device to perform the method 900.

As shown in FIG. 9, the method 900 may include detecting power up of a memory device (block 910). As further shown in FIG. 9, the method 900 may include identifying, based on detecting the power up of the memory device, a plurality of blocks of the memory device for which a power up based refresh determination is to be performed (block 920). As further shown in FIG. 9, the method 900 may include performing the power up based refresh determination on the plurality of blocks (block 930). As further shown in FIG. 9, the method 900 may include determining, based on performing the power up based refresh determination, whether a block, of the plurality of blocks, satisfies at least one of: an age condition that is based on a difference between a current time and an opening time associated with opening the block for programming, or a temperature condition that is based on a difference between a current temperature and an opening temperature associated with the block at the opening time (block 940). As further shown in FIG. 9, the method 900 may include selectively refreshing the block based on determining whether the block satisfies at least one of the age condition or the temperature condition (block 950).

The method 900 may include additional aspects, such as any single aspect or any combination of aspects described below and/or described in connection with one or more other methods or operations described elsewhere herein.

In a first aspect, the method 900 includes identifying a set of blocks, of the plurality of blocks, to be refreshed based on performing the power up based refresh determination on the plurality of blocks, wherein at least one of a corresponding age condition or a corresponding temperature condition is satisfied for each respective block included in the set of blocks, storing a set of indications, corresponding to the set of blocks, that the set of blocks is to be refreshed, and refreshing the set of blocks based on the set of indications after the power up based refresh determination has been performed for the plurality of blocks.

In a second aspect, alone or in combination with the first aspect, the set of indications comprises an indication, for each block included in the set of blocks, of a refresh priority level associated with that block.

In a third aspect, alone or in combination with one or more of the first and second aspects, the block is included in the set of blocks to be refreshed, and wherein refreshing the set of blocks comprises one of refreshing the block before executing any host commands and before refreshing any blocks associated with a low refresh priority level based on the block being associated with a high refresh priority level, or refreshing the block during an idle state of the memory device and after refreshing all blocks associated with the high refresh priority level based on the block being associated with the low refresh priority level.

In a fourth aspect, alone or in combination with one or more of the first through third aspects, selectively refreshing the block comprises refreshing the block based on a determination that the block satisfies at least one of the age condition or the temperature condition, or refraining from refreshing the block based on a determination that the block does not satisfy either of the age condition or the temperature condition.

In a fifth aspect, alone or in combination with one or more of the first through fourth aspects, identifying the plurality of blocks for which the power up based refresh determination is to be performed comprises identifying at least one of a firmware block, an open user data block, or a closed user data block.

In a sixth aspect, alone or in combination with one or more of the first through fifth aspects, the power up based refresh determination is performed only on firmware blocks, only on open user data blocks, or only on firmware blocks and open user data blocks.

In a seventh aspect, alone or in combination with one or more of the first through sixth aspects, the power up based refresh determination is initially performed on one or more high priority block types and is then performed on one or more low priority block types after refreshing all high priority block types for which a corresponding age condition or a corresponding temperature condition is satisfied.

Although FIG. 9 shows example blocks of a method 900, in some implementations, the method 900 may include additional blocks, fewer blocks, different blocks, or differently arranged blocks than those depicted in FIG. 9. Additionally, or alternatively, two or more of the blocks of the method 900 may be performed in parallel. The method 900 is an example of one method that may be performed by one or more devices described herein. These one or more devices may perform or may be configured to perform one or more other methods based on operations described herein.

Figure 10:
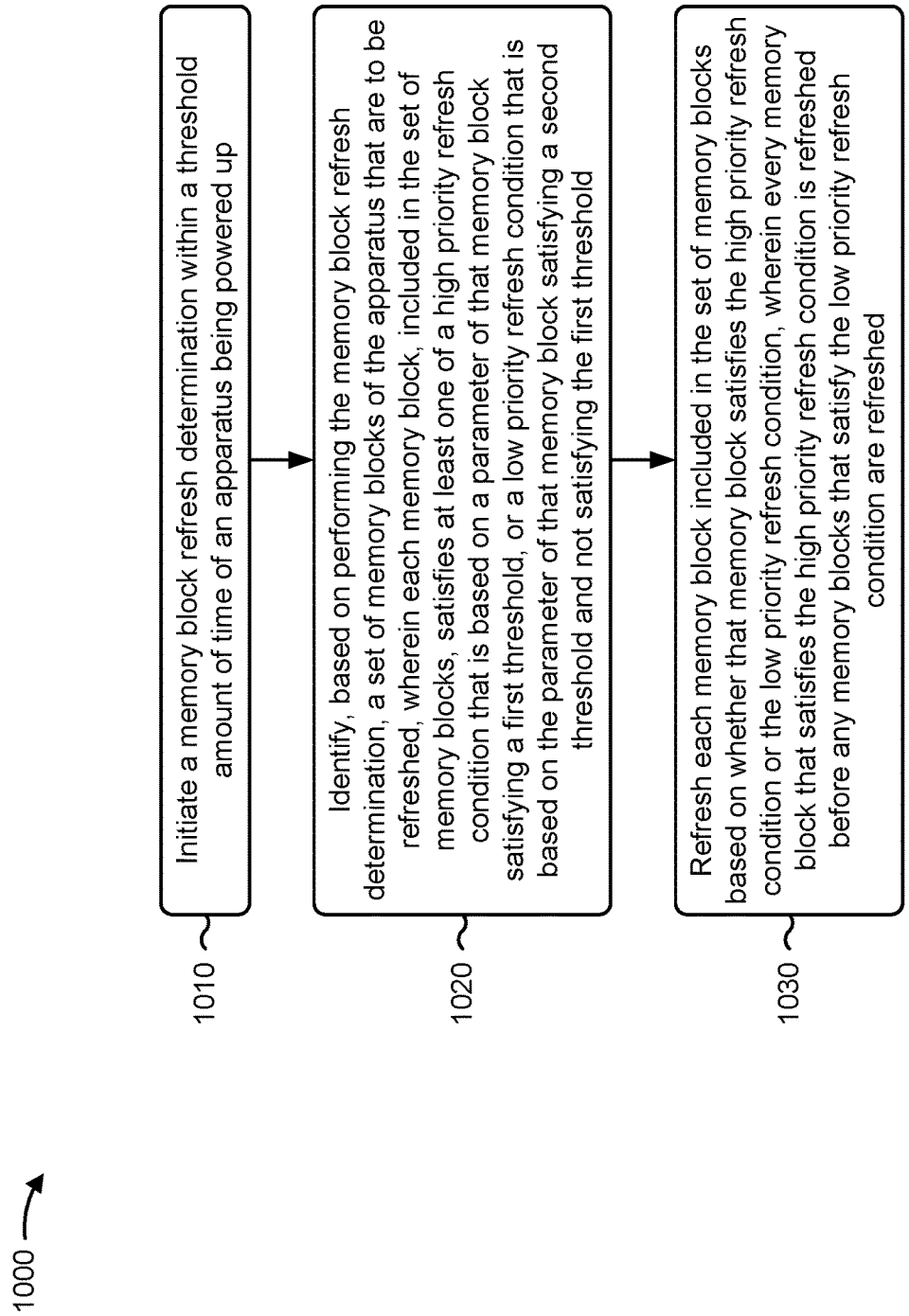

FIG. 10 is a flowchart of an example method 1000 associated with refreshing a memory block on power up based on an age and/or temperature condition. In some implementations, an apparatus (e.g., the memory device 120) may perform or may be configured to perform the method 1000. In some implementations, another device or a group of devices separate from or including the apparatus may perform or may be configured to perform the method 1000. Additionally, or alternatively, one or more components of the apparatus (e.g., the controller 130, the memory management component 240, the condition determination component 245, the indication storage component 250, the block refresh component 255, the age tracking component 260, and/or the temperature sensor 265) may perform or may be configured to perform the method 1000. Thus, means for performing the method 1000 may include the apparatus and/or one or more components of the apparatus. Additionally, or alternatively, a non-transitory computer-readable medium may store one or more instructions that, when executed by the apparatus, cause the apparatus to perform the method 1000.

As shown in FIG. 10, the method 1000 may include initiating a memory block refresh determination within a threshold amount of time of an apparatus being powered up (block 1010). As further shown in FIG. 10, the method 1000 may include identifying, based on performing the memory block refresh determination, a set of memory blocks of the apparatus that are to be refreshed, wherein each memory block, included in the set of memory blocks, satisfies at least one of a high priority refresh condition that is based on a parameter of that memory block satisfying a first threshold, or a low priority refresh condition that is based on the parameter of that memory block satisfying a second threshold and not satisfying the first threshold (block 1020). As further shown in FIG. 10, the method 1000 may include refreshing each memory block included in the set of memory blocks based on whether that memory block satisfies the high priority refresh condition or the low priority refresh condition, wherein every memory block that satisfies the high priority refresh condition is refreshed before any memory blocks that satisfy the low priority refresh condition are refreshed (block 1030).

The method 1000 may include additional aspects, such as any single aspect or any combination of aspects described below and/or described in connection with one or more other methods or operations described elsewhere herein.

In a first aspect, the high priority refresh condition for a memory block, included in the set of memory blocks, is based on an age parameter of the memory block satisfying a first age threshold, or a temperature parameter of the memory block satisfying a first temperature threshold, and wherein the low priority refresh condition for the memory block is based on the age parameter of the memory block satisfying a second age threshold and not satisfying the first age threshold, or the temperature parameter of the memory block satisfying a second temperature threshold and not satisfying the first temperature threshold.

In a second aspect, alone or in combination with the first aspect, the age parameter is a difference between a current time and an opening time associated with opening the memory block for programming.

In a third aspect, alone or in combination with one or more of the first and second aspects, the current time is a date or time at which the memory block refresh determination is initiated, or a date or time associated with powering up of the apparatus to trigger the memory block refresh determination.

In a fourth aspect, alone or in combination with one or more of the first through third aspects, the temperature parameter is a difference between a current temperature and an opening temperature associated with the memory block at an opening time associated with opening the memory block for programming.

In a fifth aspect, alone or in combination with one or more of the first through fourth aspects, the current temperature is a temperature associated with the apparatus or the memory block at a time at which the memory block refresh determination is initiated, or a temperature associated with the apparatus or the memory block at a time associated with powering up of the apparatus to trigger the memory block refresh determination.

In a sixth aspect, alone or in combination with one or more of the first through fifth aspects, at least one of the first age threshold or the second age threshold is based on a temperature associated with the apparatus, a number of program/erase cycles associated with the apparatus, or an error rate associated with the apparatus, or wherein at least one of the first temperature threshold or the second temperature threshold is based on an age associated with the apparatus, the number of program/erase cycles associated with the apparatus, or the error rate associated with the apparatus.

Although FIG. 10 shows example blocks of a method 1000, in some implementations, the method 1000 may include additional blocks, fewer blocks, different blocks, or differently arranged blocks than those depicted in FIG. 10. Additionally, or alternatively, two or more of the blocks of the method 1000 may be performed in parallel. The method 1000 is an example of one method that may be performed by one or more devices described herein. These one or more devices may perform or may be configured to perform one or more other methods based on operations described herein.

In some implementations, a memory device includes one or more components configured to: detect power up of the memory device; determine, based on detecting the power up of the memory device, that a block of the memory device satisfies at least one of: a first age condition that is based on a difference between a current time and an opening time associated with opening the block for programming, a second age condition that is based on the difference between the current time and the opening time, a first temperature condition that is based on a difference between a current temperature and an opening temperature associated with the block at the opening time, or a second temperature condition that is based on the difference between the current temperature and the opening temperature; store an indication of whether the block is to be refreshed with high priority or low priority based on determining that the block satisfies at least one of the first age condition, the second age condition, the first temperature condition, or the second temperature condition, wherein the block is to be refreshed with high priority if the first age condition or the first temperature condition is satisfied, and wherein the block is to be refreshed with low priority if the second age condition or the second temperature condition is satisfied; and refresh the block based on the indication of whether the block is to be refreshed with high priority or low priority.

In some implementations, a method includes detecting, by a memory device, power up of the memory device; identifying, by the memory device and based on detecting the power up of the memory device, a plurality of blocks of the memory device for which a power up based refresh determination is to be performed; performing, by the memory device, the power up based refresh determination on the plurality of blocks; determining, by the memory device and based on performing the power up based refresh determination, whether a block, of the plurality of blocks, satisfies at least one of: an age condition that is based on a difference between a current time and an opening time associated with opening the block for programming, or a temperature condition that is based on a difference between a current temperature and an opening temperature associated with the block at the opening time; and selectively refreshing, by the memory device, the block based on determining whether the block satisfies at least one of the age condition or the temperature condition.

In some implementations, an apparatus includes means for initiating a memory block refresh determination within a threshold amount of time of the apparatus being powered up; means for identifying, based on performing the memory block refresh determination, a set of memory blocks of the apparatus that are to be refreshed, wherein each memory block, included in the set of memory blocks, satisfies at least one of: a high priority refresh condition that is based on a parameter of that memory block satisfying a first threshold, or a low priority refresh condition that is based on the parameter of that memory block satisfying a second threshold and not satisfying the first threshold; and means for refreshing each memory block included in the set of memory blocks based on whether that memory block satisfies the high priority refresh condition or the low priority refresh condition, wherein every memory block that satisfies the high priority refresh condition is refreshed before any memory blocks that satisfy the low priority refresh condition are refreshed.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
one or more components configured to:
  detect power up of the memory device;
  determine, based on detecting the power up of the memory device, that a block of the memory device satisfies at least one of:
    a first age condition that is based on a difference between a current time and an opening time associated with opening the block for programming,
    a second age condition that is based on the difference between the current time and the opening time,
    a first temperature condition that is based on a difference between a current temperature and an opening temperature associated with the block at the opening time, or
    a second temperature condition that is based on the difference between the current temperature and the opening temperature;
  store an indication of whether the block is to be refreshed with high priority or low priority based on determining that the block satisfies at least one of the first age condition, the second age condition, the first temperature condition, or the second temperature condition,
    wherein the block is to be refreshed with the high priority if the first age condition or the first temperature condition is satisfied, and
    wherein the block is to be refreshed with the low priority if the second age condition or the second temperature condition is satisfied; and
  refresh the block based on the indication of whether the block is to be refreshed with the high priority or the low priority.

2. The memory device of claim 1, wherein the first age condition is that the difference between the current time and the opening time satisfies a first age threshold,
  wherein the second age condition is that the difference between the current time and the opening time satisfies a second age threshold and does not satisfy the first age threshold,
  wherein the first temperature condition is that the difference between the current temperature and the opening temperature satisfies a first temperature threshold, and
  wherein the second temperature condition is that the difference between the current temperature and the opening temperature satisfies a second temperature threshold and does not satisfy the first temperature threshold.

3. The memory device of claim 1, wherein the one or more components, to determine that the block of the memory device satisfies at least one of the first age condition, the second age condition, the first temperature condition, or the second temperature condition, are configured to:
   determine whether the block satisfies a first one of the first age condition or the first temperature condition;
   determine whether the block satisfies a second one of the first age condition or the first temperature condition only if the block does not satisfy the first one of the first age condition or the first temperature condition;
   determine whether the block satisfies a first one of the second age condition or the second temperature condition only if the block does not satisfy the first one of the first age condition or the first temperature condition and does not satisfy the second one of the first age condition or the first temperature condition; and
   determine whether the block satisfies a second one of the second age condition or the second temperature condition only if the block does not satisfy the first one of the second age condition or the second temperature condition, does not satisfy the first one of the first age condition or the first temperature condition, and does not satisfy the second one of the first age condition or the first temperature condition.

4. The memory device of claim 1, wherein the opening time is one of:
   a time at which the block is configured for writing of initial data to the block,
   a time at which the block is assigned a host-addressable address,
   a time at which the initial data is programmed to the block, or
   a time at which data is programmed to the block after erasing the block.

5. The memory device of claim 1, wherein the one or more components are further configured to:
   detect that the power up of the memory device is an initial power up of a time period or that a threshold amount of time has elapsed since a prior power up or a prior power down; and
   wherein the one or more components, to determine that the block of the memory device satisfies at least one of the first age condition, the second age condition, the first temperature condition, or the second temperature condition, are configured to:
      determine that the block of the memory device satisfies at least one of the first age condition, the second age condition, the first temperature condition, or the second temperature condition based on detecting that the power up of the memory device is the initial power up of the time period or that the threshold amount of time has elapsed since the prior power up or the prior power down.

6. The memory device of claim 1, wherein the block is:
   a host-addressable user data block that is partially written, or
   a non-host addressable block that stores firmware.

7. The memory device of claim 1, wherein the one or more components are further configured to identify the opening time and the opening temperature based on the block and based on a data structure stored in memory of the memory device,
   wherein the data structure stores a plurality of entries corresponding to a plurality of blocks, including the block, of the memory device, and
   wherein each entry, of the plurality of entries, identifies a respective block, a corresponding opening time associated with the respective block, and a corresponding opening temperature associated with the respective block.

8. The memory device of claim 1, wherein the one or more components, to refresh the block, are configured to:
   copy data stored in the block to a new block;
   determine a new opening time and a new opening temperature associated with the new block; and
   store information that identifies the new block, the new opening time, and the new opening temperature in an entry of a data structure.

9. The memory device of claim 8, wherein the one or more components are further configured to:
   erase the block;
   determine an updated time and an updated temperature associated with the block after erasing the block and in connection with writing new data to the block after the block has been erased; and
   update an entry of the data structure, associated with the block, to indicate that the block is associated with the updated time and the updated temperature.

10. The memory device of claim 1, wherein the one or more components, to refresh the block based on the indication of whether the block is to be refreshed with the high priority or the low priority, are configured to:
    refresh the block before refreshing one or more blocks that are to be refreshed with the low priority based on a determination that the block is to be refreshed with the high priority, or
    refresh the block after refreshing one or more blocks that are to be refreshed with the high priority based on a determination that the block is to be refreshed with the low priority.

11. A method, comprising:
    detecting, by a memory device, power up of the memory device;
    identifying, by the memory device and based on detecting the power up of the memory device, a plurality of blocks of the memory device for which a power up based refresh determination is to be performed;
    performing, by the memory device, the power up based refresh determination on the plurality of blocks;
    determining, by the memory device and based on performing the power up based refresh determination, whether a block, of the plurality of blocks, satisfies at least one of:
       an age condition that is based on a difference between a current time and an opening time associated with opening the block for programming, or
       a temperature condition that is based on a difference between a current temperature and an opening temperature associated with the block at the opening time; and
    selectively refreshing, by the memory device, the block based on determining whether the block satisfies at least one of the age condition or the temperature condition.

12. The method of claim 11, further comprising:
    identifying a set of blocks, of the plurality of blocks, to be refreshed based on performing the power up based refresh determination on the plurality of blocks,
       wherein at least one of a corresponding age condition or a corresponding temperature condition is satisfied for each respective block included in the set of blocks;

storing a set of indications, corresponding to the set of blocks, that the set of blocks is to be refreshed; and refreshing the set of blocks based on the set of indications after the power up based refresh determination has been performed for the plurality of blocks.

13. The method of claim 12, wherein the set of indications comprises an indication, for each block included in the set of blocks, of a refresh priority level associated with that block.

14. The method of claim 13, wherein the block is included in the set of blocks to be refreshed; and wherein refreshing the set of blocks comprises one of:
refreshing the block before executing any host commands and before refreshing any blocks associated with a low refresh priority level based on the block being associated with a high refresh priority level, or
refreshing the block during an idle state of the memory device and after refreshing all blocks associated with the high refresh priority level based on the block being associated with the low refresh priority level.

15. The method of claim 11, wherein selectively refreshing the block comprises:
refreshing the block based on a determination that the block satisfies at least one of the age condition or the temperature condition, or
refraining from refreshing the block based on a determination that the block does not satisfy either of the age condition or the temperature condition.

16. The method of claim 11, wherein identifying the plurality of blocks for which the power up based refresh determination is to be performed comprises identifying at least one of a firmware block, an open user data block, or a closed user data block.

17. The method of claim 11, wherein the power up based refresh determination is performed only on firmware blocks, only on open user data blocks, or only on the firmware blocks and the open user data blocks.

18. The method of claim 11, wherein the power up based refresh determination is initially performed on one or more high priority block types and is then performed on one or more low priority block types after refreshing all high priority block types for which a corresponding age condition or a corresponding temperature condition is satisfied.

19. An apparatus, comprising:
means for initiating a memory block refresh determination within a threshold amount of time of the apparatus being powered up;
means for identifying, based on performing the memory block refresh determination, a set of memory blocks of the apparatus that are to be refreshed,
wherein each memory block, included in the set of memory blocks, satisfies at least one of:
a high priority refresh condition that is based on a parameter of that memory block satisfying a first threshold, the parameter of that memory block being based on a difference between a current time and an opening time associated with opening that memory block for programming or based on a difference between a current temperature and an opening temperature associated with that block at the opening time, or a low priority refresh condition that is based on the parameter of that memory block satisfying a second threshold and not satisfying the first threshold; and means for refreshing each memory block included in the set of memory blocks based on whether that memory block satisfies the high priority refresh condition or the low priority refresh condition,
wherein every memory block that satisfies the high priority refresh condition is refreshed before any memory blocks that satisfy the low priority refresh condition are refreshed.

20. The apparatus of claim 19, wherein the high priority refresh condition for a memory block, included in the set of memory blocks, is based on:
an age parameter of the memory block satisfying a first age threshold, or
a temperature parameter of the memory block satisfying a first temperature threshold; and
wherein the low priority refresh condition for the memory block is based on:
the age parameter of the memory block satisfying a second age threshold and not satisfying the first age threshold, or
the temperature parameter of the memory block satisfying a second temperature threshold and not satisfying the first temperature threshold.

21. The apparatus of claim 20, wherein the age parameter is the difference between the current time and the opening time.

22. The apparatus of claim 21, wherein the current time is:
a date or time at which the memory block refresh determination is initiated, or
a date or time associated with powering up of the apparatus to trigger the memory block refresh determination.

23. The apparatus of claim 20, wherein the temperature parameter is the difference between the current temperature and the opening temperature associated with that memory block.

24. The apparatus of claim 23, wherein the current temperature is:
a temperature associated with the apparatus or the memory block at a time at which the memory block refresh determination is initiated, or
a temperature associated with the apparatus or the memory block at a time associated with powering up of the apparatus to trigger the memory block refresh determination.

25. The apparatus of claim 20, wherein at least one of the first age threshold or the second age threshold is based on a temperature associated with the apparatus, a number of program/erase cycles associated with the apparatus, or an error rate associated with the apparatus, or
wherein at least one of the first temperature threshold or the second temperature threshold is based on an age associated with the apparatus, the number of program/erase cycles associated with the apparatus, or the error rate associated with the apparatus.

* * * * *